(12) United States Patent
Park et al.

(10) Patent No.: US 12,279,487 B2
(45) Date of Patent: Apr. 15, 2025

(54) DISPLAY DEVICE AND METHOD OF FABRICATING THE SAME

(71) Applicant: Samsung Display Co., Ltd., Yongin-Si (KR)

(72) Inventors: Sang Jin Park, Yongin-si (KR); Young Dae Kim, Seoul (KR); Young Seok Baek, Hwaseong-si (KR); Dong Hyun Yang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 402 days.

(21) Appl. No.: 17/741,111

(22) Filed: May 10, 2022

(65) Prior Publication Data
US 2023/0157088 A1 May 18, 2023

(30) Foreign Application Priority Data
Nov. 18, 2021 (KR) .................. 10-2021-0159471

(51) Int. Cl.
*H01L 27/32* (2006.01)
*H01L 27/12* (2006.01)
(Continued)

(52) U.S. Cl.
CPC ......... *H10K 59/124* (2023.02); *H01L 27/127* (2013.01); *H10K 59/1213* (2023.02); *H01L 27/1248* (2013.01)

(58) Field of Classification Search
CPC ............. H10K 59/124; H10K 59/1213; H10K 59/10–221; H10K 50/00–88;
(Continued)

(56) References Cited

U.S. PATENT DOCUMENTS

2005/0110090 A1  5/2005  Koo et al.
2019/0280067 A1  9/2019  Jeong et al.
(Continued)

FOREIGN PATENT DOCUMENTS

EP  0928015 A2 *  7/1999  ......... H01L 29/6659
JP  2004-146416 A  5/2004
(Continued)

OTHER PUBLICATIONS

WO Searh Report, PCT Application No. PCT/KR2022/017761 dated Feb. 23, 2023, 3 pages.

*Primary Examiner* — Shahed Ahmed
(74) *Attorney, Agent, or Firm* — Innovation Counsel LLP

(57) ABSTRACT

Provided are display device and method of fabricating the same. The display device comprises a substrate, a first semiconductor layer, a first gate insulating layer, a first gate electrode dispose, a first interlayer insulating layer, a first oxide semiconductor layer, a second gate insulating layer and a second gate electrode sequentially disposed on the substrate, spacers disposed on side surfaces of the second gate electrode, and a second interlayer insulating layer disposed on the spacers, wherein each of the spacers comprises a first spacer disposed to contact a side surface of the second gate electrode and a second spacer disposed on the first spacer. A concentration of hydrogen included in the first spacer is lower than a concentration of hydrogen included in the second spacer.

17 Claims, 24 Drawing Sheets

(51) Int. Cl.
*H10K 59/121* (2023.01)
*H10K 59/124* (2023.01)

(58) Field of Classification Search
CPC ............ H10K 59/00–95; H01L 27/127; H01L 27/1248; H01L 29/42384; H01L 29/78621; H01L 27/1225; H01L 27/124; H01L 27/1259; H01L 29/6653; H01L 29/66553; H01L 21/28132–2815
See application file for complete search history.

(56) References Cited

U.S. PATENT DOCUMENTS

| | | | |
|---|---|---|---|
| 2020/0168638 A1* | 5/2020 | Je | H01L 27/1237 |
| 2021/0050398 A1 | 2/2021 | Kim et al. | |
| 2022/0208915 A1* | 6/2022 | Son | H10K 59/124 |
| 2023/0077098 A1* | 3/2023 | Kim | H10K 59/1213 |

FOREIGN PATENT DOCUMENTS

| | | |
|---|---|---|
| KR | 10-2000-0039312 A | 7/2000 |
| KR | 10-2005-0050491 A | 5/2005 |
| KR | 2009-0124656 A | 12/2009 |
| KR | 10-2019-0107233 A | 9/2019 |
| KR | 10-2021-0021218 A | 2/2021 |

\* cited by examiner

FIG. 2
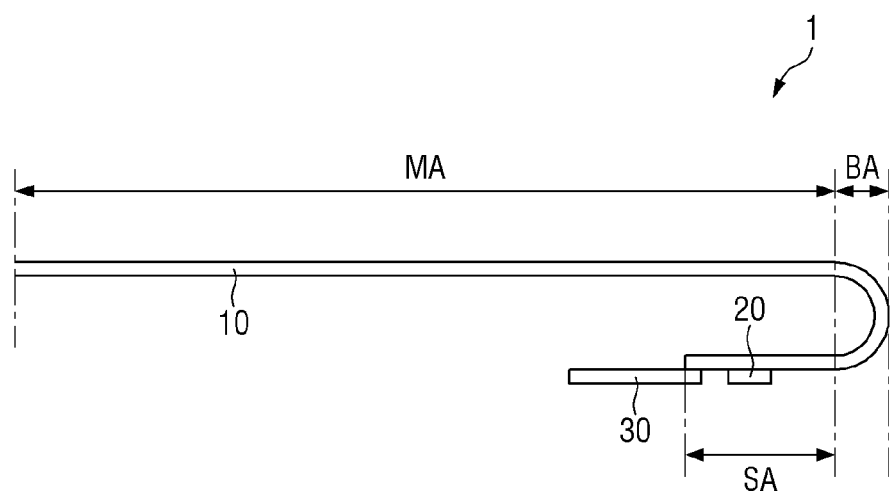
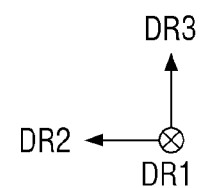

DISPLAY DEVICE AND METHOD OF FABRICATING THE SAME

This application claims priority to Korean Patent Application No. 10-2021-0159471 filed on Nov. 18, 2021, in the Korean Intellectual Property Office, and all the benefits accruing therefrom under 35 U.S.C. 119, the contents of which in its entirety are herein incorporated by reference.

BACKGROUND

1. Field

The disclosure relates to a display device and a method of fabricating the same.

2. Description of the Related Art

As the information society develops, demands for display devices for displaying images are increasing in various forms. The display devices may be flat panel displays such as liquid crystal displays, field emission displays, and light emitting displays. The light emitting displays may include an organic light emitting display including an organic light emitting diode as a light emitting element and an inorganic light emitting display including an inorganic light emitting diode as a light emitting element.

Among them, the organic light emitting display displays an image using the organic light emitting diode that generates light through recombination of electrons and holes. The organic light emitting display includes a plurality of transistors that provide a driving current to the organic light emitting diode. Each of the transistors may include an active layer, and the active layers of the transistors may include different materials.

SUMMARY

Aspects of the disclosure provide a display device having improved element characteristics of a switching transistor including an oxide semiconductor layer.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device comprises a substrate, a first semiconductor layer disposed on the substrate, a first gate insulating layer disposed on the first semiconductor layer, a first gate electrode disposed on the first gate insulating layer and overlapping the first semiconductor layer, a first interlayer insulating layer disposed on the first gate electrode, a first oxide semiconductor layer disposed on the first interlayer insulating layer not to overlap the first semiconductor layer, a second gate insulating layer disposed on the first oxide semiconductor layer, a second gate electrode disposed on the second gate insulating layer and overlapping the first oxide semiconductor layer, spacers disposed on side surfaces of the second gate electrode, and a second interlayer insulating layer disposed on the spacers, wherein each of the spacers comprises a first spacer disposed to contact a side surface of the second gate electrode and a second spacer disposed on the first spacer. A concentration of hydrogen included in the first spacer may be lower than a concentration of hydrogen included in the second spacer.

A lower surface and an inner side surface of the second spacer may contact the first spacer, and an outer side surface of the second spacer may have a curved shape.

An upper surface of the second gate electrode may directly contact the second interlayer insulating layer.

A concentration of hydrogen included in the second interlayer insulating layer may be higher than the concentration of hydrogen included in each of the first spacer and the second spacer.

The first semiconductor layer may comprise a first channel region overlapping the first gate electrode, and the first oxide semiconductor layer may comprise a second channel region overlapping the second gate electrode and the spacers.

A length of the second channel region may be greater than a width of the second gate electrode.

A length of the first channel region may be the same as a width of the first gate electrode.

The first semiconductor layer may comprise a first source/drain region and a second source/drain region spaced apart from each other with the first channel region interposed therebetween, and the first oxide semiconductor layer may comprise a third source/drain region and a fourth source/drain region spaced apart from each other with the second channel region interposed therebetween.

The second channel region may comprise a first region overlapping the second gate electrode, a second region having a higher hydrogen concentration than the first region, and a third region having a higher hydrogen concentration than the second region.

The display device may further comprise a third gate insulating layer disposed between the first gate electrode and the second gate insulating layer, and a bottom light-blocking pattern and a capacitor first electrode disposed between the second gate insulating layer and the third gate insulating layer, wherein the first gate electrode may overlap the capacitor first electrode in a thickness direction, and the first oxide semiconductor layer may be directly disposed on the third gate insulating layer and overlap the bottom light-blocking pattern in the thickness direction.

The display device may further comprise a first contact hole and a second contact hole which is formed through the first gate insulating layer, the second gate insulating layer, the third gate insulating layer, the first interlayer insulating layer, and the second interlayer insulating layer, and a third contact hole and a fourth contact hole which is formed through the second gate insulating layer and the second interlayer insulating layer.

The display device may further comprise a first source/drain electrode disposed on the second interlayer insulating layer and connected to the first semiconductor layer exposed through the first contact hole, a second source/drain electrode disposed on the second interlayer insulating layer and connected to the first semiconductor layer exposed through the second contact hole, a third source/drain electrode disposed on the second interlayer insulating layer and connected to the first oxide semiconductor layer exposed through the third contact hole, and a fourth source/drain electrode disposed on the second interlayer insulating layer and connected to the first oxide semiconductor layer exposed through the fourth contact hole.

According to an embodiment of the disclosure, a display device comprising a pixel connected to a scan line and a data line intersecting the scan line, wherein the pixel comprises a light emitting element, a first transistor which controls a driving current supplied to the light emitting element according to a data voltage applied from the data line, a second transistor which applies a voltage to the first transistor according to a scan signal transmitted to the scan line, wherein the first transistor comprises a first semiconductor layer and a first gate electrode disposed on the first semiconductor layer, and the second transistor comprises a first oxide semiconductor layer and a second gate electrode disposed on the first oxide semiconductor layer, a first spacer which is disposed on a first gate insulating layer disposed between the first oxide semiconductor layer and the second gate electrode and is disposed on each side surface of the second gate electrode, and a second spacer which is disposed on the first spacer. A concentration of hydrogen included in the first spacer may be lower than a concentration of hydrogen included in the second spacer.

The first spacer may have a lower surface in contact with an upper surface of the first gate insulating layer and a side surface in contact with each side surface of the first gate electrode, and the second spacer may have a lower surface and an inner side surface in contact with the first spacer and has an outer side surface having a curved shape.

The first oxide semiconductor layer may comprise a channel region overlapping the second gate electrode and the spacers, and the channel region may comprise a first region overlapping the second gate electrode, a second region having a higher hydrogen concentration than the first region, and a third region having a higher hydrogen concentration than the second region.

The display device may further comprise a first interlayer insulating layer which is disposed on the second gate electrode and the first gate insulating layer, wherein a concentration of hydrogen included in the first interlayer insulating layer may be higher than the concentration of hydrogen included in each of the first spacer and the second spacer.

The display device may further comprise a second gate insulating layer which is disposed between the first semiconductor layer and the first gate electrode, wherein the first oxide semiconductor layer may be disposed on the second gate insulating layer.

According to an embodiment of the disclosure, a method of fabricating a display device, the method comprises preparing a substrate on which a first semiconductor layer, a first gate insulating layer disposed on the first semiconductor layer, a first gate electrode disposed on the first gate insulating layer and a first interlayer insulating layer disposed on the first gate electrode are disposed, forming a first oxide semiconductor layer on the first interlayer insulating layer not to overlap the first semiconductor layer, forming a second gate insulating layer disposed on the first oxide semiconductor layer and a second gate electrode disposed on the second gate insulating layer to overlap the first oxide semiconductor layer, forming a first spacer layer on the second gate electrode and the second gate insulating layer and a second spacer layer disposed on the first spacer layer and forming a first spacer disposed on each side surface of the second gate electrode and a second spacer disposed on the first spacer by etching the first spacer layer and the second spacer layer, and implanting ions into the first oxide semiconductor layer and forming a second interlayer insulating layer on the second gate electrode and the second spacer, wherein the first spacer has a lower surface in contact with an upper surface of the first gate insulating layer and a side surface in contact with each side surface of the first gate electrode, and the second spacer has a lower surface and an inner side surface in contact with the first spacer and has an outer side surface having a curved shape. A concentration of hydrogen included in the first spacer may be lower than a concentration of hydrogen included in the second spacer.

BRIEF DESCRIPTION OF THE DRAWINGS

These and/or other aspects will become apparent and more readily appreciated from the following description of the embodiments, taken in conjunction with the accompanying drawings in which:

FIG. 2 is a side view of the display device of FIG. 1 after being bent;

DETAILED DESCRIPTION

The inventive concept will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the inventive concept. Similarly, the second element could also be termed the first element.

Hereinafter, embodiments will be described with reference to the accompanying drawings.

Figure 1:
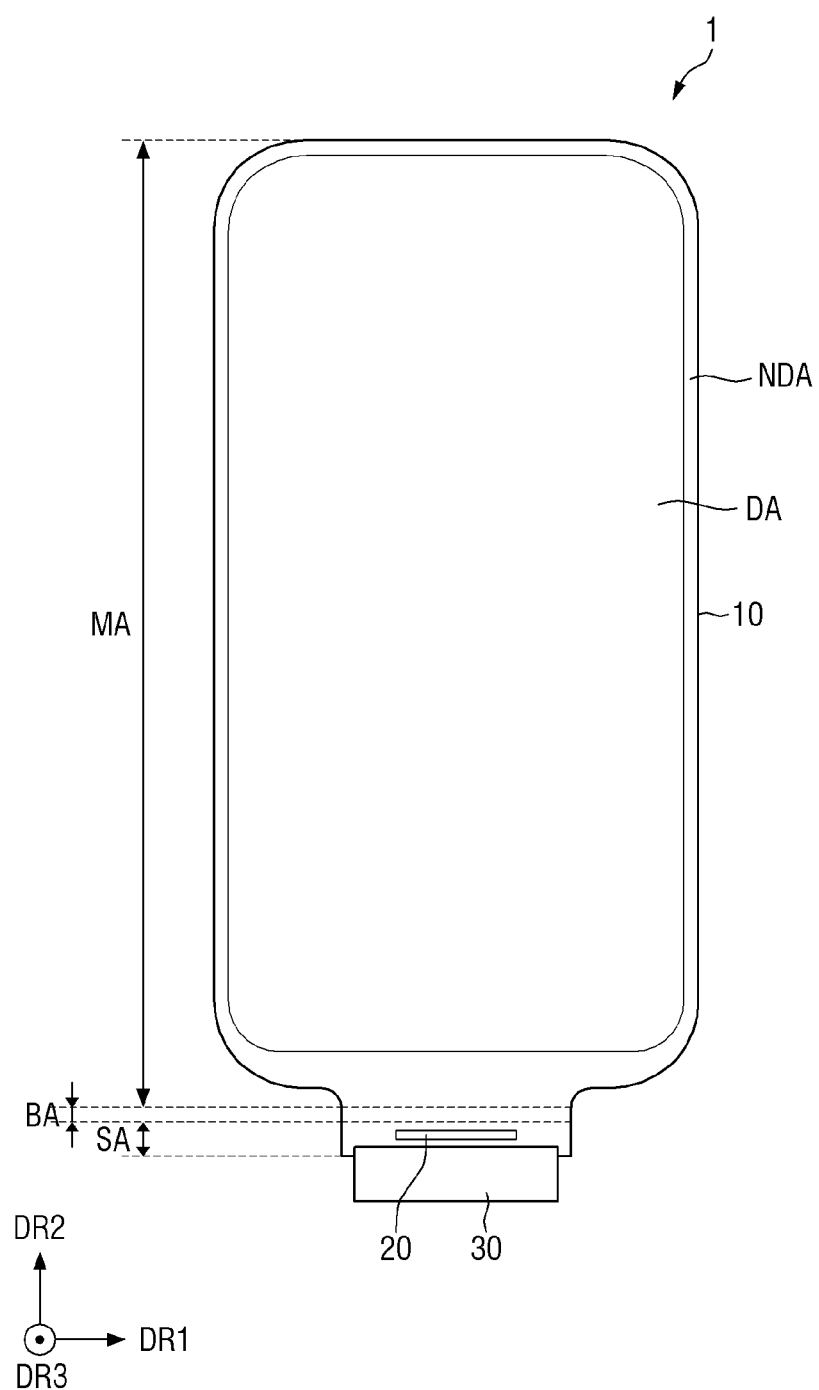
FIG. 1 is a plan view of a display device according to an embodiment.

FIG. 1 is a plan view of a display device 1 according to an embodiment. FIG. 2 is a side view of the display device 1 of FIG. 1 after being bent. FIG. 2 illustrates a side shape of the display device 1 after being bent in a thickness direction.

Referring to FIGS. 1 and 2, the display device 1 displays moving images or still images. The display device 1 may refer to any electronic device that provides a display screen. Examples of the display device 1 may include a television, a notebook computer a monitor, a billboard, a display for Internet of things (IoT), a mobile phone, a smartphone, a tablet personal computer (PC), an electronic watch, a smart watch, a watch phone, a bead mounted display, a mobile communication terminal, an electronic notebook, an electronic book, a portable multimedia player (PMP), a navigation device, a game console, a digital camera and a camcorder, all of which provide a display screen.

The display device 1 according to the embodiment may be substantially rectangular in a plan view. The display device 1 may be shaped like a rectangle with right-angled corners in a plan view. However, the disclosure is not limited thereto, and the display device 1 may also be shaped like a rectangle with rounded corners in a plan view.

The display device 1 includes a display panel 10 that provides a display screen. Examples of the display panel 10 may include an inorganic light emitting diode display panel, an organic light emitting display panel, a quantum dot light emitting display panel, a plasma display panel, and a field emission display panel. The display device 1 including an organic light emitting element will be described below as an example of the display panel 10. However, the disclosure is not limited thereto, and other display panels can also be applied as long as the same technical spirit is applicable. The display panel 10 may be a flexible substrate including a flexible polymer material such as polyimide. Accordingly, the display panel 10 can be bent, curved, folded, or rolled.

In the drawings, a first direction DR1 indicates a horizontal direction of the display device 1 in a plan view, and a second direction DR2 indicates a vertical direction of the display device 1 in a plan view. In addition, a third direction DR3 indicates a thickness direction of the display device 1. The first direction DR1 and the second direction DR2 perpendicularly intersect each other. The third direction DR3 is a direction intersecting a plane in which the first direction DR1 and the second direction DR2 lie and perpendicularly intersects both the first direction DR1 and the second direction DR2. However, directions mentioned in embodiments should be understood as relative directions, and the embodiments are not limited to the mentioned directions.

Unless otherwise defined, the terms "upper," "upper surface" and "upper side" used herein based on the third direction DR3 refer to a display surface side of the display panel 10, and the terms "lower," "lower surface" and "lower side" refer to an opposite side of the display panel 10 from the display surface side.

The display panel 10 may include a display area DA where an image is displayed and a non-display area NDA where no image is displayed. The display panel 10 may include the display area DA and the non-display area NDA in a plan view. The non-display area NDA may surround the display area DA. The non-display area NDA may form a bezel.

The display area DA may be shaped like a rectangle with right-angled corners or a rectangle with rounded corners in a plan view. The display area DA may have short sides and long sides. The short sides of the display area DA may be sides extending in the first direction DR1. The long sides of the display area DA may be sides extending in the second direction DR2. However, the planar shape of the display area DA is not limited to a rectangular shape, and the display area DA may also have a circular shape, an oval shape, or other various shapes.

The display area DA may include a plurality of pixels. Each of the pixels may include a light emitting layer and a circuit layer for controlling the amount of light emitted from the light emitting layer. The circuit layer may include a wiring, an electrode, and at least one transistor. The light emitting layer may include an organic light emitting material. The light emitting layer may be sealed by an encapsulation film. The specific configuration of each pixel will be described later.

The non-display area NDA may be disposed adjacent to both short sides and both long sides of the display area DA. In this case, the non-display area NDA may completely surround all sides of the display area DA and may form edges of the display area DA. However, the disclosure is not limited thereto, and the non-display area NDA may also be disposed adjacent only to both short sides or both long sides of the display area DA.

The display panel 10 may include a main area MA and a bending area BA connected to a side of the main area MA in the second direction DR2. The display panel 10 may further include a sub-area SA which is connected to the bending area BA along the second direction DR2 and overlaps the main area MA in the thickness direction.

The display area DA may be located in the main area MA. The non-display area NDA may be located in an edge part around the display area DA of the main area MA.

The main area MA may have a shape similar to the planar shape of the display device 1. The main area MA may be a flat area located in one plane. However, the disclosure is not limited thereto, and at least one of edges of the main area MA excluding an edge (side) connected to the bending area BA may also be curved or may be bent perpendicularly.

If at least one of the edges of the main area MA excluding the edge (side) connected to the bending area BA is curved or bent, the display area DA may also be disposed at the curved or bent edge. However, the disclosure is not limited thereto, and the non-display area NDA that does not display an image or both the display area DA and the non-display area NDA may also be disposed at the curved or bent edge.

The non-display area NDA of the main area MA may extend from an outer boundary of the display area DA to edges of the display panel 10. Signal wirings or driving circuits for transmitting signals to the display area DA may be disposed in the non-display area NDA of the main area MA.

The bending area BA may be connected to a short side of the main area MA. A width (in the first direction DR1) of the bending area BA may be narrower than a width (of a short side) of the main area MA. Parts where the main area MA is connected to the bending area BA may be cut in an L shape to reduce a width of the bezel.

In the bending area BA, the display panel 10 may be bent with a curvature in a direction opposite to a display surface. As the display panel 10 is bent in the bending area BA, the main area MS may face one direction, for example, an upward direction, the sub-area SA may face the other direction facing the one direction, for example, an downward direction, and the bending area which face directions between the one direction and the other direction.

The sub-area SA extends from the bending area BA. After the completion of bending, the sub-area SA may extend substantially parallel to the main area MA. The sub-area SA may overlap the main area MA in the thickness direction of the display panel 10.

The sub-area SA may overlap the non-display area NDA at an edge of the main area MA and may further overlap the display area DA of the main area MA. A width of the sub-area SA may be, but is not necessarily, equal to the width of the bending area BA.

A pad part may be disposed on the sub-area SA of the display panel 10. External devices may be mounted (or attached) on the pad part. Examples of the external devices include a driver chip 20 and a driving board that includes a flexible printed circuit board or a rigid printed circuit board. In addition, a wiring connection film, a connector, etc. may be mounted on the pad part as external devices. Only one external device or a plurality of external devices may be mounted on the sub-area SA. For example, as illustrated in FIGS. 1 and 2, the driver chip 20 may be disposed on the sub-area SA of the display panel 10, and the driving board 30 may be attached to an end of the sub-area SA. In this case, the display panel 10 may include both a pad part connected to the driver chip 20 and a pad part connected to the driving board 30. In an embodiment, a driver chip may be mounted on a film, and the film may be attached to the sub-area SA of the display panel 10.

The driver chip 20 may be mounted on a surface of the display panel 10 that is the same surface as the display surface. As the surface of the display panel 10 is reversed by the bending of the bending area BA as described above, an upper surface of the driver chip 20 mounted on the surface of the display panel 10 may face downward.

The driver chip 20 may be attached onto the display panel 10 by an anisotropic conductive film or may be attached onto the display panel 10 by ultrasonic bonding. A horizontal width of the driver chip 20 may be smaller than a horizontal width of the display panel 10. The driver chip 20 may be disposed in a central part of the sub-area SA in the horizontal direction (the first direction DR1), and left and right edges of the driver chip 20 may be spaced apart from left and right edges of the sub-area SA, respectively.

The driver chip 20 may include an integrated circuit for driving the display panel 10. In an embodiment, the integrated circuit may be a data driver integrated circuit which generates and provides data signals, but the disclosure is not limited thereto. The driver chip 20 is connected to wiring pads provided in the pad part of the display panel 10 and provides data signals to the wiring pads. Wirings connected to the wiring pads extend toward the pixels and transmit the data signals to the pixels.

Figure 3:
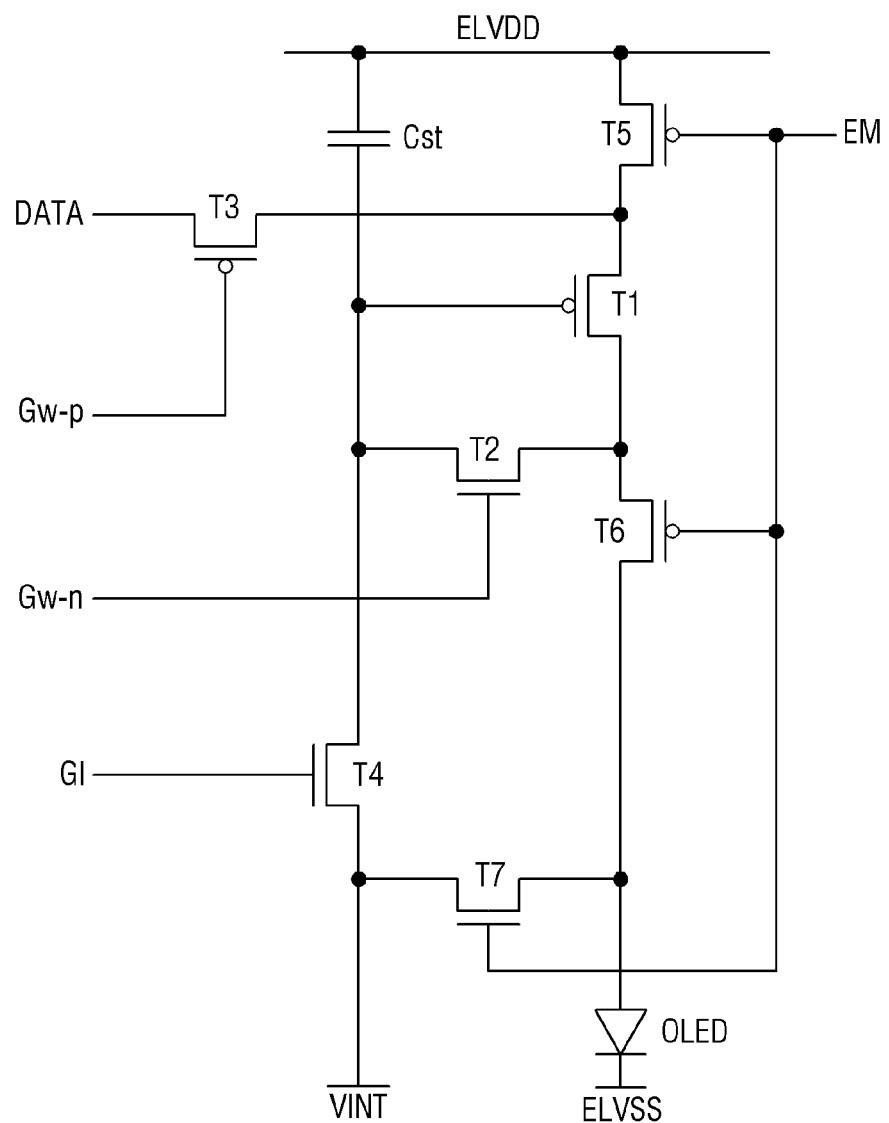
FIG. 3 is an equivalent circuit diagram of a pixel of the display device according to the embodiment.

FIG. 3 is an equivalent circuit diagram of a pixel of the display device 1 according to the embodiment.

Referring to FIG. 3, a pixel circuit of the display device 1 includes an organic light emitting element OLED, a plurality of transistors T1 through T7, and a capacitor Cst. A data signal DATA, a first scan signal Gw-p, a second scan signal Gw-n, a third scan signal GI, an emission control signal EM, a first power supply voltage ELVDD, a second power supply voltage ELVSS, and an initialization voltage VINT are applied to the circuit of a pixel.

The organic light emitting element OLED includes an anode and a cathode. The capacitor Cst includes a first electrode and a second electrode.

The transistors may include first through seventh transistors T1 through T7. Each of the transistors T1 through T7 includes a gate electrode, a first source/drain electrode, and a second source/drain electrode. Any one of the first source/drain electrode and the second source/drain electrode of each of the transistors T1 through T7 is a source electrode, and the other is a drain electrode.

Each of the transistors T1 through T7 may be a thin-film transistor. Each of the transistors T1 through T7 may be any one of a p-channel metal oxide semiconductor (PMOS) transistor and an n-channel metal oxide semiconductor (NMOS) transistor. In an embodiment, the first transistor T1 which is a driving transistor, the third transistor T3 which is a data transfer transistor, the fifth transistor T5 which is a first emission control transistor, and the sixth transistor T6 which is a second emission control transistor may be PMOS transistors. On the other hand, the second transistor T2 which is a compensation transistor, the fourth transistor T4 which is a first initialization transistor, and the seventh transistor T7 which is a second initialization transistor may be NMOS transistors. PMOS transistors and NMOS transistors may have different characteristics. The second transistor T2, the fourth transistor T4 and the seventh transistor T7 may be formed as NMOS transistors having relatively excellent turn-off characteristics. Thus, in the display device 10, leakage of a driving current during an emission period of the organic light emitting element OLED may be reduced.

The first transistor T1 may have the gate electrode connected to the first electrode of the capacitor Cst. The first source/drain electrode of the first transistor T1 may be connected to a first power supply voltage (ELVDD) terminal via the fifth transistor T5, and the second source/drain electrode of the first transistor T1 may be connected to the anode of the organic light emitting element OLED via the sixth transistor T6. The first transistor T1 receives the data signal DATA according to a switching operation of the third transistor T3 and supplies a driving current to the organic light emitting element OLED.

The third transistor T3 may have the gate electrode connected to a first scan signal (Gw-p) terminal. The first source/drain electrode of the third transistor T3 may be connected to a data signal (DATA) terminal, and the second source/drain electrode of the third transistor T3 may be connected to the first source/drain electrode of the first transistor T1 and may be connected to the first power supply voltage (ELVDD) terminal via the fifth transistor T5. The third transistor T3 may be turned on in response to the first scan signal Gw-p to transmit the data signal DATA to the first source/drain electrode of the first transistor T1.

The second transistor T2 has the gate electrode connected to a second scan signal (Gw-n) terminal. The first source/drain electrode of the second transistor T2 may be connected to the second source/drain electrode of the first transistor T1 and may be connected to the anode of the organic light emitting element OLED via the sixth transistor T6. The second source/drain electrode of the second transistor T2 may be connected to the first electrode of the capacitor Cst, the first source/drain electrode of the fourth transistor T4, and the gate electrode of the first transistor T1. The second transistor T2 is turned on in response to the second scan signal Gn-p to connect the gate electrode and the second source/drain electrode of the first transistor T1, thereby diode-connecting the first transistor T1. Accordingly, a voltage difference corresponding to a threshold voltage of the first transistor T1 is generated between the first source/drain electrode and the gate electrode of the first transistor T1. The threshold voltage deviation of the first transistor T1 may be compensated for by supplying the data signal DATA that is compensated for the threshold voltage to the gate electrode of the first transistor T1.

The fourth transistor T4 may have the gate electrode connected to the third scan signal (GI) terminal. The second source/drain electrode of the fourth transistor T4 may be connected to an initialization voltage (VINT) terminal, and the first source/drain electrode of the fourth transistor T4 may be connected to the first electrode of the capacitor Cst, the second source/drain electrode of the second transistor T2, and the gate electrode of the first transistor T1. The fourth transistor T4 may be turned on in response to the third scan signal GI to transmit the initialization voltage VINT to the gate electrode of the first transistor T1, thereby initializing the voltage of the gate electrode of the first transistor T1.

The fifth transistor T5 may have the gate electrode connected to an emission control signal (EM) terminal. The first source/drain electrode of the fifth transistor T5 may be connected to the first power supply voltage (ELVDD) terminal, and the second source/drain electrode of the fifth transistor T5 may be connected to the first source/drain electrode of the first transistor T1 and the second source/drain electrode of the second transistor T2.

The sixth transistor T6 may have the gate electrode connected to the emission control signal (EM) terminal. The first source/drain electrode of the sixth transistor T6 may be connected to the second source/drain electrode of the first transistor T1 and the first source/drain electrode of the second transistor T2, and the second source/drain electrode of the sixth transistor T6 may be connected to the anode of the organic light emitting element OLED.

The fifth transistor T5 and the sixth transistor T6 may be simultaneously turned on in response to the emission control signal EM. Accordingly, a driving current may flow through the organic light emitting element OLED.

The seventh transistor T7 may have the gate electrode connected to the emission control signal (EM) terminal. The first source/drain electrode of the seventh transistor T7 may be connected to the anode of the organic light emitting element OLED, and the second source/drain electrode of the seventh transistor T7 may be connected to the initialization voltage (VINT) terminal. The seventh transistor T7 may be turned on in response to the emission control signal EM to initialize the anode of the organic light emitting element OLED.

The seventh transistor T7 receives the same emission control signal EM as the fifth transistor T5 and the sixth transistor T6. However, since the seventh transistor T7 is an NMOS transistor while the fifth transistor T5 and the sixth transistor T6 are PMOS transistors, they may be turned on at different timings. When the emission control signal EM is at a high level, the seventh transistor T7 is turned on, and the fifth transistor T5 and the sixth transistor T6 are turned off. When the emission control signal EM is at a low level, the seventh transistor T7 is turned off, and the fifth transistor T5 and the sixth transistor T6 are turned on. An initialization operation by the seventh transistor T7 may not be performed at an emission time when the fifth transistor T5 and the sixth transistor T6 are turned on but may be performed at a non-emission time when the fifth transistor T5 and the sixth transistor T6 are turned off.

In the current embodiment, a case where the gate electrode of the seventh transistor T7 receives the emission control signal EM is described as an example. However, in an embodiment, the pixel circuit may also be configured such that the gate electrode of the seventh transistor T7 receives the third scan signal GI or another scan signal.

The second electrode of the capacitor Cst may be connected to the first power supply voltage (ELVDD) terminal. The first electrode of the capacitor Cst may be connected to the gate electrode of the first transistor T1, the second source/drain electrode of the second transistor T2, and the first source/drain electrode of the fourth transistor T4. The cathode of the organic light emitting element OLED may be connected to a second power supply voltage (ELVSS) terminal. The organic light emitting element OLED may receive a driving current from the first transistor T1 and emit light to display an image.

Figure 4:
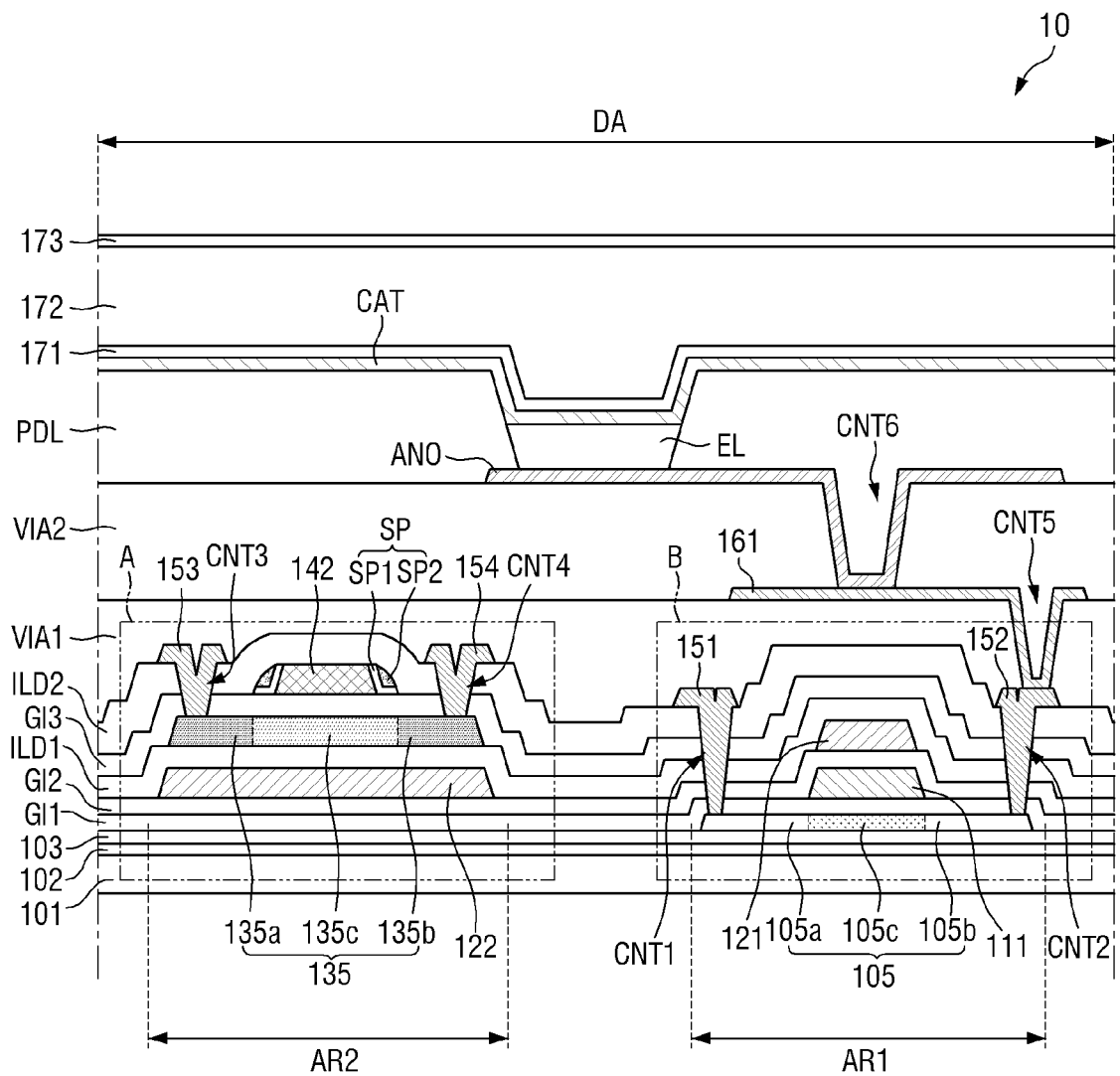
FIG. 4 is a cross-sectional view of a pixel of the display device according to the embodiment.
Figure 5:
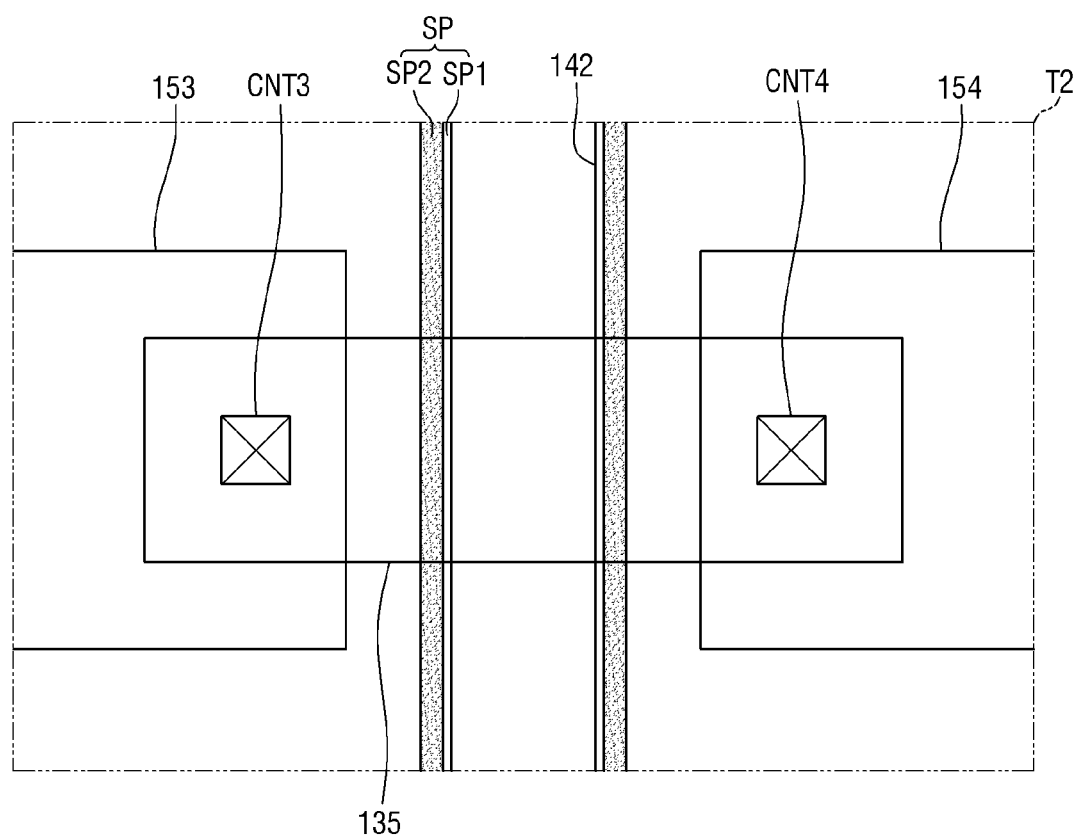
FIG. 5 is a plan view of a second transistor of the display device according to the embodiment.
Figure 6:
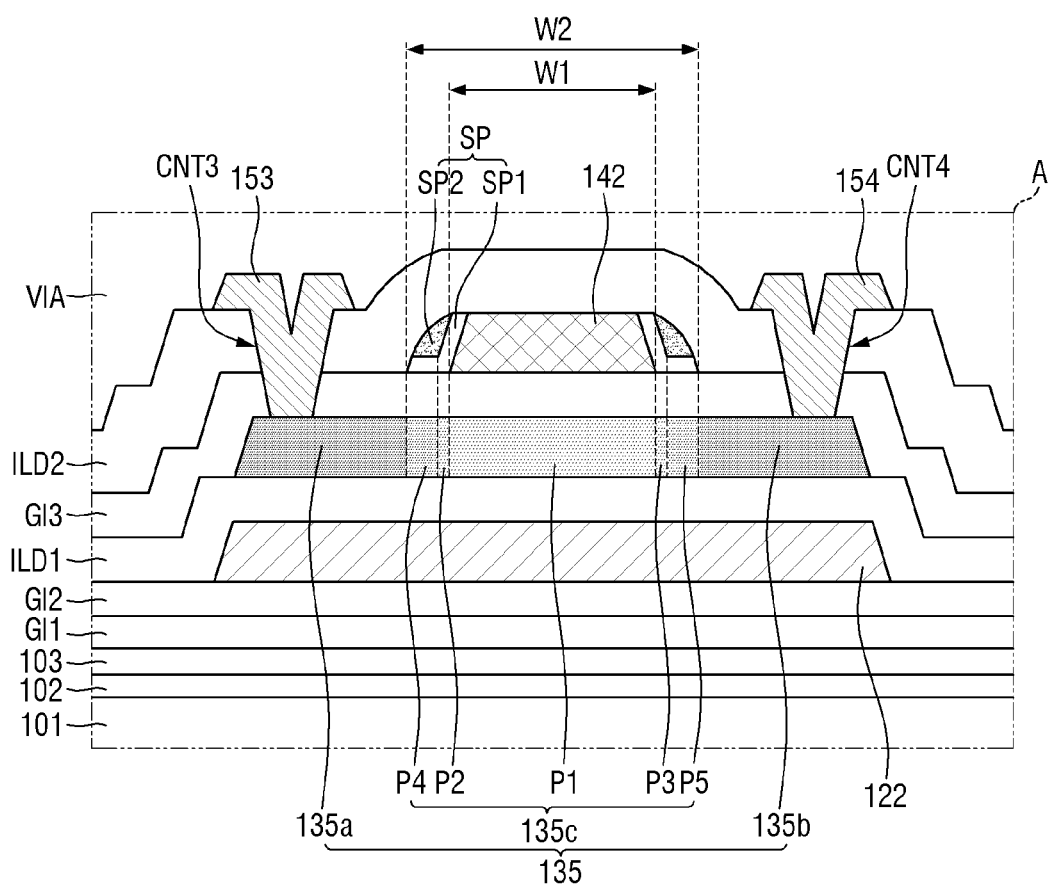
FIG. 6 is an enlarged view of part A of FIG. 4.
Figure 7:
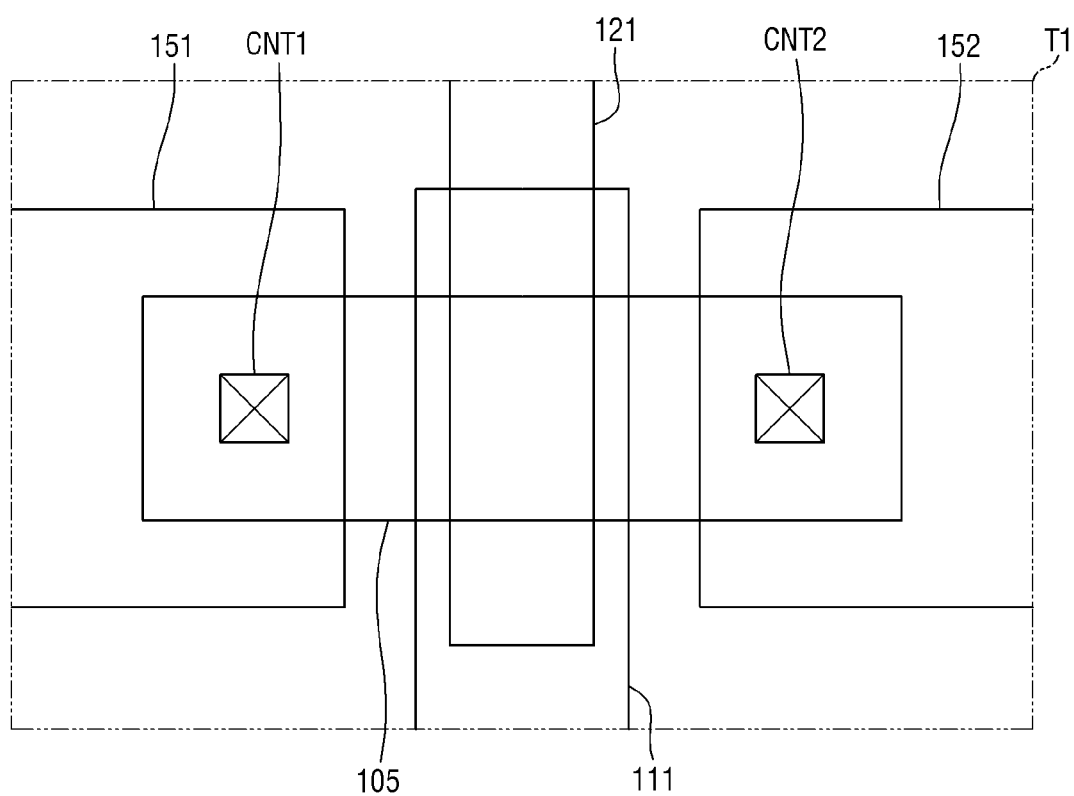
FIG. 7 is a plan view of a first transistor of the display device according to the embodiment.
Figure 8:
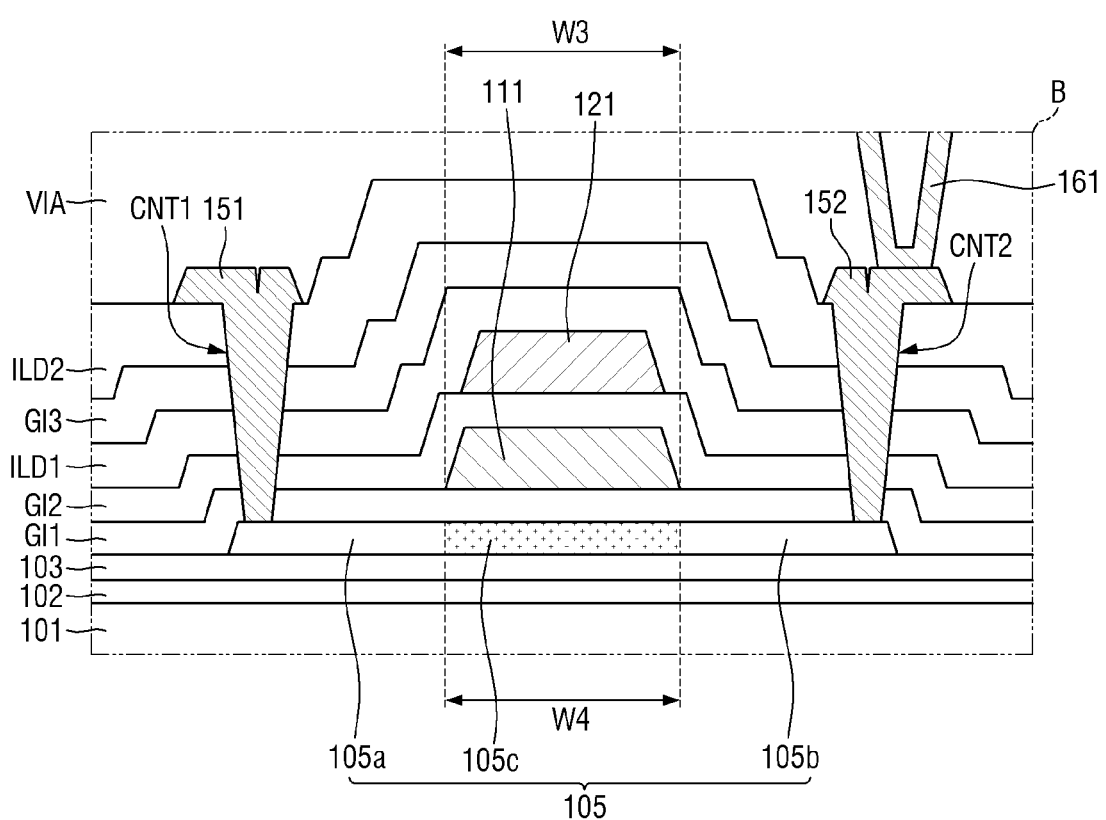
FIG. 8 is an enlarged view of part B of FIG. 4.

FIG. 4 is a cross-sectional view of a pixel of the display device 1 according to the embodiment. FIG. 5 is a plan view of the second transistor T2 of the display device 1 according to the embodiment. FIG. 6 is an enlarged view of part A of FIG. 4. FIG. 7 is a plan view of the first transistor T1 of the display device 1 according to the embodiment. FIG. 8 is an enlarged view of part B of FIG. 4.

FIG. 4 illustrates transistors T1 and T2 included in a pixel in the display panel 10 of the display device 1. FIGS. 5 and 6 illustrate schematic plan and cross-sectional views of the second transistor T2 as an oxide transistor disposed in an oxide transistor area AR2. FIGS. 7 and 8 illustrate schematic plan and cross-sectional views of the first transistor T1 as a silicon transistor disposed in a silicon transistor area AR1.

Referring to FIGS. 4 through 8, the display panel 10 of the display device 1 may include the silicon transistor area AR1 in which a non-oxide inorganic semiconductor transistor (hereinafter, referred to as a 'silicon transistor') including polycrystalline silicon is disposed and the oxide transistor area AR2 in which an oxide semiconductor transistor (hereinafter, referred to as an 'oxide transistor') including an oxide semiconductor is disposed.

The silicon transistor disposed in the silicon transistor area AR1 may be a PMOS transistor. In FIG. 4, the first transistor T1 which is a driving transistor is illustrated as an example of the silicon transistor. The oxide transistor disposed in the oxide transistor area AR2 may be an NMOS transistor. In FIG. 4, the second transistor T2 which is a compensation transistor is illustrated as an example of the oxide transistor.

The third transistor T3, the fifth transistor T5, and the sixth transistor T6 may be other silicon transistors disposed in the silicon transistor area AR1. The third transistor T3, the fifth transistor T5, and the sixth transistor T6 may have substantially the same structure as the first transistor T1. The fourth transistor T4 and the seventh transistor T7 may be other oxide transistors disposed in the oxide transistor area AR2. The fourth transistor T4 and the seventh transistor T7 may have substantially the same structure as the second transistor T2.

The display panel 10 of the display device 1 may include a substrate 101, a barrier layer 102, a buffer layer 103, a first semiconductor layer 105, a first gate insulating layer GI1 a first conductive layer 110, a second gate insulating layer GI2, a second conductive layer 120, a first interlayer insulating layer ILD1, a first oxide semiconductor layer 135, a third gate insulating layer GI3, a third conductive layer 140, a second interlayer insulating layer ILD2, a fourth conductive layer 150, a first via layer VIA1, a fifth conductive layer 160, a second via layer VIA2, an anode ANO, a pixel defining layer PDL, a cathode CAT, a light emitting layer EL, and a thin-film encapsulation layer 170. Each of the above layers may be a single layer but may also be a multilayer in which a plurality of identical or different layers are stacked.

The substrate 101 may support each layer disposed thereon. The substrate 101 may include an insulating material such as polymer resin. The polymer material may be, for example, polyethersulphone (PES), polyacrylate (PA), polyarylate (PAR), polytherimide (PEI), polyethylene naphthalate (PEN), polyethylene terephthalate (PET), polyphenylene sulfide (PPS), polyallylate, polyimide (PI), polycarbonate: (PC), cellulose triacetate (CAT), cellulose acetate propionate (CAP), or a combination of the same. The substrate 101 tray also include a metal material.

The substrate 101 may be a flexible substrate that can be bent, folded, rolled, etc. The material that forms the flexible substrate may be, but is not limited to, polyimide (PI).

When the display device 1 is of a bottom emission type or a double-sided emission type, a transparent substrate may be used. When the display device 1 is of a top emission type, not only a transparent substrate but also a translucent or opaque substrate may be applied.

The barrier layer 102 may be disposed on the substrate 101. The barrier layer 102 may prevent diffusion of impurity ions, prevent penetration of moisture or outside air, and perform a surface planarization function. The barrier layer 102 may include at least one of silicon oxide ($SiO_x$), silicon nitride ($SiN_x$), and silicon oxynitride ($SiO_xN_y$). The buffer layer 102 may also be omitted depending on the type of the substrate 101 or process conditions.

The buffer layer 103 may be disposed on the barrier layer 102. The buffer layer 103 may include at least one of silicon oxide ($SiO_x$), silicon nitride ($SiN_x$), and silicon oxynitride ($SiO_xN_y$). The buffer layer 103 may also be omitted depending on the type of the substrate 101 or process conditions.

The first semiconductor layer 105 may be disposed on the buffer layer 103. The first semiconductor layer 105 may be disposed in the silicon transistor area AR1.

The first semiconductor layer 105 may include a non-oxide semiconductor. For example, the first semiconductor layer 105 may include polycrystalline silicon, monocrystalline silicon, or amorphous silicon. When the first semiconductor layer 105 is the polycrystalline silicon, the polycrystalline silicon may be formed by crystallizing amorphous silicon using a crystallization method such as a rapid thermal annealing (RTA) method, a solid phase crystallization (SPC) method, an excimer laser annealing (ELA) method, a metal induced crystallization (MIC) method, a metal induced lateral crystallization (MILC) method, or a sequential lateral solidification (SLS) method.

The first semiconductor layer 105 may include a channel region 105c overlapping a first gate electrode III in the thickness direction and a first source/drain region 105a and a second source/drain region 105b located on one side and the other side of the channel region 105c, respectively. The first and second source/drain regions 105a and 105b of the first semiconductor layer 105 may include a plurality of carrier ions. Thus, the first and second source/drain regions 105a and 105b may have higher conductivity and lower electrical resistance than the channel region 105c.

The first semiconductor layer 105 may include semiconductor layers (or active layers) of the first transistor T1, the third transistor T3, the fifth transistor T5 and the sixth transistor T6 described above and may include channels of the same. The first semiconductor layer 105 may include a channel region, a first source/drain region and a second source/drain region of each of the first transistor T1, the third transistor T3, the fifth transistor T5, and the sixth transistor T6 described above.

The first gate insulating layer GI1 may be disposed on the first semiconductor layer 105. The first gate insulating layer GI1 may not only cover an upper surface of the first semiconductor layer 105 excluding parts in which contact holes CNT1 and CNT2 are formed, but may also cover side surfaces of the first semiconductor layer 105. The first gate insulating layer GI1 may be substantially disposed over the entire surface of the substrate 101.

The first gate insulating layer GI1 may include a silicon compound, a metal oxide, or the like. For example, the first gate insulating layer GI1 may include silicon oxide ($SiO_x$), silicon nitride ($SiN_x$), silicon oxynitride ($SiO_xN_y$), aluminum oxide ($AlO_x$), tantalum oxide ($TaO_x$), hafnium oxide ($HfO_x$), zirconium oxide ($ZrO_x$), or titanium oxide ($TiO_x$). The first gate insulating layer GI1 may have a single layer structure that includes any one of the above materials or may have a multilayer structure that includes two or more layers.

The first conductive layer 110 is disposed on the first gate insulating layer GI1. The first conductive layer 110 is a gate conductive layer and may include the first gate electrode 111 disposed in the silicon transistor area AR1. The first gate electrode 111 may be a gate electrode of a silicon transistor. The first gate electrode 111 may be connected to the first electrode of the capacitor Cst. The first electrode of the capacitor Cst may be formed of the first gate electrode 111 itself or may be formed of a part extending from the first gate electrode 111. For example, a part of a pattern of the first conductive layer 110 may overlap the first semiconductor layer 105 to function as the first gate electrode 111 in that part. Another part of the pattern of the first conductive layer 110 may not overlap the first semiconductor layer 105 and may overlap a second electrode 121 of the capacitor Cst disposed thereon to function as the first electrode of the capacitor Cst. However, the disclosure is not limited thereto.

The first conductive layer 110 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second gate insulating layer GI2 may be disposed on the first conductive layer 110. The second gate insulating layer GI2 may not only cover an upper surface of the first conductive layer 110 excluding parts in which the contact holes CNT1 and CNT2 are formed, but may also cover side surfaces of the first conductive layer 110. The second gate insulating layer GI2 may be substantially disposed over the entire surface of the substrate 101.

The second gate insulating layer GI2 may include a silicon compound, a metal oxide, or the like. For example, the second gate insulating layer GI2 may include silicon oxide ($SiO_x$), silicon nitride ($SiN_x$), silicon oxynitride ($SiO_xN_y$), aluminum oxide ($AlO_x$), tantalum oxide ($TaO_x$), hafnium oxide ($HfO_x$), zirconium oxide ($ZrO_x$), or titanium oxide ($TiO_x$). The second gate insulating layer GI2 may have: a single layer structure that includes any one of the above materials or may have a multilayer structure that includes two or more layers.

The second conductive layer 120 is disposed on the second gate insulating layer GI2. The second conductive layer 120 is a capacitor conductive layer and may include the second electrode 121 of the capacitor Cst disposed in the silicon transistor area AR1 and a bottom light-blocking pattern 122 disposed in the oxide transistor area AR2. The second electrode 121 of the capacitor Cst may overlap the first electrode of the capacitor Cst connected to the first gate electrode 111 disposed thereunder with the second gate insulating layer GI2 interposed therebetween. The second electrode 121 of the capacitor Cst may form the capacitor Cst together with the first electrode of the capacitor Cst.

The bottom light-blocking pattern 122 may prevent light incident from under the display panel 10 from entering the first oxide semiconductor layer 135 located thereon. The bottom light-blocking pattern 122 may overlap at least a channel region 135c of the first oxide semiconductor layer 135 and may cover at least the channel region 135c of the first oxide semiconductor layer 135. Although the bottom light-blocking pattern 122 overlaps the entire area of the first oxide semiconductor layer 135 in the drawings, the disclosure is not limited thereto. In some embodiments, the bottom light-blocking pattern 122 may be disposed to cover only the channel region 135c of the first oxide semiconductor layer 135.

In some embodiments, the bottom light-blocking pattern 122 may be used as another gate electrode of an oxide transistor. In this case, the bottom light-blocking pattern 122 may be electrically connected to a second gate electrode 142 or any one of a third source/drain electrode 153 and a fourth source/drain electrode 154 of a transistor disposed in the oxide transistor area AR2.

The second conductive layer 120 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The first interlayer insulating layer ILD1 is disposed on the second conductive layer 120. The firsttterlayer insulating layer ILD1 may not only cover an upper surface of the second conductive layer 120 excluding parts in which contact holes CNT1 through CNT4 are formed, but may also cover side surfaces of the second conductive layer 120. The first interlayer insulating layer ILD1 may be substantially disposed over the entire surface of the substrate 101.

The first interlayer insulating layer ILD1 may include a silicon compound, a metal oxide, or the like. For example, the first interlayer insulating layer ILD1 may include silicon oxide ($SiO_x$), silicon nitride ($SiN_x$), silicon oxynitride ($SiO_xN_y$), aluminum oxide ($AlO_x$), tantalum oxide ($TaO_x$), hafnium oxide ($HfO_x$), zirconium oxide ($ZrO_x$), or titanium oxide ($TiO_x$). The first interlayer insulating layer ILD1 may have a single layer structure that includes any one of the above materials or may have a multilayer structure that includes two or more layers.

The first oxide semiconductor layer 135 is disposed on the first interlayer insulating layer ILD1. The first oxide semiconductor layer 135 may be disposed in the oxide transistor area AR2. The first oxide semiconductor layer 135 may include an oxide semiconductor. The oxide may include one or more oxides selected from zinc (Zn), indium (In), gallium (Ga), tin (Sn), cadmium (Cd), germanium (Ge), hafnium (Hf), and combinations of the same. For example, the first oxide semiconductor layer 135 may include at least one of indium gallium zinc oxide (IGZO), zinc tin oxide (ZTO), and indium tin oxide (IZO).

The first oxide semiconductor layer 135 may include the channel region 135c overlapping the second gate electrode 142 disposed thereon in the thickness direction and a third source/drain region 135a and a fourth source/drain region 135b located on one side and the other side of the channel region 135c, respectively. The third and fourth source/drain regions 135a and 135b of the first oxide semiconductor layer 135 may be conductive regions and may have higher conductivity and lower electrical resistance than the channel region 135c.

The first oxide semiconductor layer 135 may include semiconductor layers of the second transistor T2, the fourth transistor T4, and the seventh transistor T7 described above and may include channels of the same. The first oxide semiconductor layer 135 may include a channel region, a first source/drain region and a second source/drain region of each of the second transistor T2, the fourth transistor T4, and the seventh transistor T7 described above.

The third gate insulating layer GI3 is disposed on the first oxide semiconductor layer 135. The third gate insulating layer GI3 may not only cover an upper surface of the first oxide semiconductor layer 135 excluding parts in which the contact holes CNT1 through CNT4 are formed, but may also cover side surfaces of the first oxide semiconductor layer 135. The third gate insulating layer GI3 may be substantially disposed over the entire surface of the substrate 101.

The third gate insulating layer GI3 may include a silicon compound, a metal oxide, or the like. For example, the third gate insulating layer GI3 may include silicon oxide ($SiO_x$), silicon nitride ($SiN_x$), silicon oxynitride ($SiO_xN_y$), aluminum oxide ($AlO_x$), tantalum oxide ($TaO_x$), hafnium oxide ($HfO_x$), zirconium oxide ($ZrO_x$), or titanium oxide ($TiO_x$). The third gate insulating layer GI3 may have a single layer structure that includes any one of the above materials or may have a multilayer structure that includes two or more layers.

The third conductive layer 140 is disposed on the third gate insulating layer GI3. The third conductive layer 140 is a gate conductive layer and may include the second gate electrode 142 of a transistor disposed in the oxide transistor area AR2. The second gate electrode 142 may be a gate electrode of an oxide transistor.

The third conductive layer 140 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

According to an embodiment, the display device 1 may include spacers SP (SP1 and SP2) disposed on side surfaces of the third conductive layer, for example, the second gate electrode. The second transistor T2 may include the first oxide semiconductor layer 135 as an oxide transistor and may include the second gate electrode 142 disposed on the first oxide semiconductor layer 135. The spacers SP may be disposed on side surfaces of the second gate electrode 142 of the second transistor T2.

For example, the spacers SP may be disposed on side surfaces of the second gate electrode 142 of the third conductive layer 140 on the third gate insulating layer GI3. Lower surfaces of the spacers SP may directly contact an upper surface of the third gate insulating layer GI3, and inner side surfaces of the spacers SP may directly contact the side surfaces of the second gate electrode 142. In an embodiment in which the second gate electrode 142 of the third conductive layer 140 extends in the second direction DR2, the spacers SP disposed on the side surfaces of the second gate electrode 142 may also extend in the second direction DR2. However, the spacers SP may not be disposed on an upper surface of the second gate electrode 142, and the upper surface of the second gate electrode 142 may directly contact the second interlayer insulating layer ILD2 to be described later.

According to an embodiment, each of the spacers SP may include a first spacer SP1 and a second spacer SP2 disposed on the first spacer SP1. The first spacer SP1 may be disposed on the third gate insulating layer GI3 to directly contact a side surface of the second gate electrode 142, and the second spacer SP2 may be directly disposed on the first spacer SP1. A part of each spacer SP which contacts each of the third gate insulating layer GI3 and the second gate electrode 142 may be the first spacer SP1.

The first spacer SP1 may include a first part covering a side surface of the second gate electrode 142 and a second part connected to the first part and directly disposed on the third gate insulating layer GI3. A material forming the first spacer SP1 may be disposed on the third gate insulating layer GI3 to completely cover the second gate electrode 142 and then may be etched to expose the upper surface of the second gate electrode 142. Accordingly, an inner side surface of the first part of the first spacer SP1 may be in contact with a side surface of the second gate electrode 142, and a lower surface of the second part may be in contact with the upper surface of the third gate insulating layer GI3 in the vicinity of the second gate electrode 142. The first part and the second part of the first spacer SRI may be connected to each other on the third gate insulating layer GI3. The first spacer SP1 may not be disposed on the upper surface of the second gate electrode 142.

The second spacer SP2 is disposed on the first spacer SP1. Like the first spacer SP1, the second spacer SP2 may not be disposed on the second gate electrode 142. An inner side surface of the second spacer SP2 may be in direct contact with the first part of the first spacer SP1, and a lower surface of the second spacer SP2 may be in direct contact with an upper surface of the second part of the first spacer SP1. The first spacer SP1 may have a shape according to a step formed by the second gate electrode 142 on the third gate insulating layer GI3, and the second spacer SP2 may have a shape having a gently curved outer side surface.

In the second transistor T2 which is an oxide semiconductor, the channel region 135c of the first oxide semiconductor layer 135 may overlap the second gate electrode 142 and the spacers SP. In an ion doping process for forming the source/drain regions 135a and 135b in the first oxide semiconductor layer 135, a region of the first oxide semiconductor layer 135 which overlaps the spacers SP may not be doped with ions. The channel region 135c of the first oxide semiconductor layer 135 may be formed in a region overlapping the second gate electrode 142 and the spacers SP.

A first width W1 of the second gate electrode 142 may be smaller than a second width W2 of the channel region 135c of the first oxide semiconductor layer 135, and the second width W2 of the channel region 135c of the first oxide semiconductor layer 135 may be the same as the sum of the first width W1 of the second gate electrode 142 and widths of the spacers SP disposed on both side surfaces of the second gate electrode 142. The source/drain regions 135a and 135b may be formed on both sides of the channel region 135c of the first oxide semiconductor layer 135, that is, in parts not overlapping the spacers SP. On the other hand, in the first transistor T1 which is a silicon transistor, the channel region 105c of the first semiconductor layer 105 may overlap the first gate electrode 111. A third width W3 of the first gate electrode 111 may be substantially the same as the third width W3 of the channel region 105c of the first semiconductor layer 105.

According to an embodiment, the first spacer SP1 and the second spacer SP2 may each include an insulating material layer and may include materials having different hydrogen (H) contents. Each of the first spacer SP1 and the second spacer SP2 may include one of silicon oxide ($SiO_x$), silicon nitride ($SiN_x$), silicon oxynitride ($SiO_xN_y$), aluminum oxide ($AlO_x$), tantalum oxide ($TaO_x$), hafnium oxide ($HfO_x$), zirconium oxide ($ZrO_x$), and titanium oxide ($TiO_x$). However, the hydrogen content of the first spacer SP1 may be lower than the hydrogen content of the second spacer SP2. The hydrogen contents of the first spacer SP1 and the second spacer SP2 may also be different from that of the second interlayer insulating layer ILD2 to be described later. The hydrogen content of each of the first spacer SP1 and the second spacer SP2 may be lower than that of the second interlayer insulating layer ILD2. For example, the first spacer SP1 may include an ultra-low hydrogen film material, the second spacer SP2 may include a low hydrogen film material, and the second interlayer insulating layer ILD2 may include a high hydrogen film material.

In a process of forming the second transistor T2, after the second gate electrode 142 is formed, a process of forming the second interlayer insulating layer ILD2 to be described later and the source/drain electrodes 153 and 154 of the fourth conductive layer 150 is performed. When a deposition process for forming the second interlayer insulating layer ILD2, a process of forming contact holes formed through the second interlayer insulating layer ILD2, and a subsequent heat treatment process are performed, hydrogen included in the second interlayer insulating layer ILD2 may be diffused to the first oxide semiconductor layer 135 through the third gate insulating layer GI3. The hydrogen diffused to the first oxide semiconductor layer 135 may become carriers in the semiconductor layer while filling oxygen vacancies in the oxide semiconductor.

The spacers SP disposed on the side surfaces of the second gate electrode 142 may include a material having a low hydrogen content to prevent diffusion of hydrogen from the second interlayer insulating layer ILD2 to the first oxide semiconductor layer 135. The hydrogen diffused from the second interlayer insulating layer ILD2 may be diffused to the source/drain regions 135a and 135b of the first oxide semiconductor layer 135 which do not overlap the spacers SP. A smaller amount of hydrogen may be diffused to the channel region 135c of the first oxide semiconductor layer 135 which overlaps the spacers SP than to the sourceldrain regions 135a and 135b, and a further smaller amount of hydrogen may be diffused to the channel region 135c of the first oxide semiconductor layer 135 which overlaps the second gate electrode 142.

According to an embodiment, the first oxide semiconductor layer 135 disposed to overlap the spacers SP1 and SP2 may include regions P1 through P5 having different hydrogen concentrations. Each of the source/drain regions 135a and 135b of the first oxide semiconductor layer 135 may include a greater amount of hydrogen than the channel region 135c. The channel region 135c of the first oxide semiconductor layer 135 may include a first region P1, a second region P2 and a third region P3 having a higher hydrogen concentration than the first region P1, and a fourth region P4 and a fifth region P5 having a higher hydrogen concentration than the second and third regions P2 and P3. The first region P1 may be a region overlapping the second gate electrode 142, and the second through fifth regions P2 through P5 may be regions overlapping the spacers SP1 and SP2. The second region P2 and the third region P3 may be regions overlapping the first spacer SP1 including an ultra-low hydrogen film material but not overlapping the lower surface of the second spacer SP2. The fourth region P4 and the fifth region P5 may be regions overlapping the first spacer S1 and the lower surface of the second spacer SP2 including a low hydrogen film material. Since the first region P1 is disposed to overlap the second gate electrode 142, it may be a region to which the smallest amount of hydrogen is diffused from the second interlayer insulating layer ILD2. The amount of hydrogen diffused may gradually increase from the first region P1 toward the source/drain regions 135a and 135b. The channel region 135c of the first oxide semiconductor layer 135 may have a hydrogen concentration gradation according to position. Since the first oxide semiconductor layer 135 includes the channel region 135c having the hydrogen concentration gradation, it may have excellent switching characteristics even if the channel region 135c has a short length.

However, in some embodiments, the second region P2 and the third region P3 overlapping the first spacer SP1 may not overlap the lower surface of the second spacer SP2, but a part of the second spacer SP2 which is disposed on the first spacer SP1 may partially overlap the second region P2 and the third region P3. Alternatively, the second region P2 and the third region P3 may partially overlap the lower surface of the second spacer SP2. However, most of the second region P2 and the third region P3 may overlap the first spacer SP1, and the first spacer SP1 may overlap a larger area of the second region P2 and the third region P3 than the second spacer SP2. The above description may be equally applied to the description of the overlapping relationship between the first region P1, the fourth region P4 and the fifth region P5 and the second electrode 142 and the second spacer SP2.

The first transistor T1 may be a driving transistor of the pixel circuit that includes a silicon transistor, and the second transistor T2 may be a switching transistor of the pixel circuit that includes an oxide transistor. In the switching transistor, a threshold voltage Vth according to a gate voltage applied to a gate electrode is required to have a value equal to or greater than a predetermined value.

Figure 9:
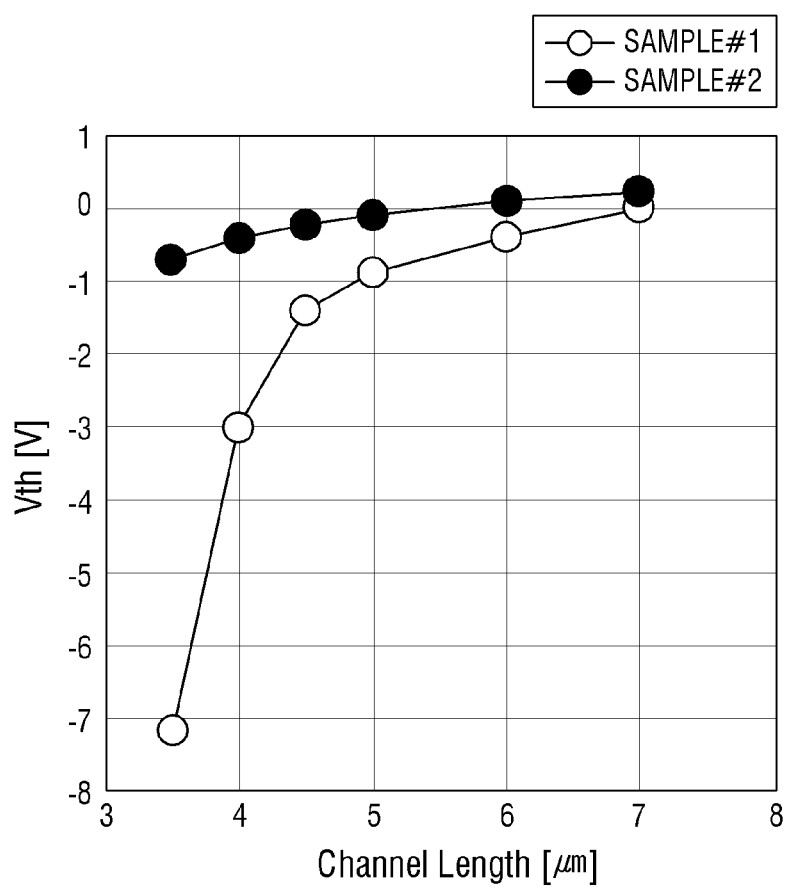
FIG. 9 is a graph illustrating the threshold voltage with respect to the length of a channel region of a transistor including an oxide semiconductor.

FIG. 9 is a graph illustrating the threshold voltage with respect to the length of a channel region of a transistor including an oxide semiconductor.

FIG. 9 illustrates the variation in the threshold voltage Yth with respect to the channel lengths of transistors in which SAMPLE #1 is a transistor not having a spacer and SAMPLE #2 is a transistor having the spacer, for example, the spacers SP1 and SP2. A SAMPLE #1 transistor is a transistor in which the spacers SP1 and SP2 are not formed on side surfaces of a gate electrode, and a SAMPLE #2 transistor is a transistor in which the spacers SP1 and SP2 are formed on side surfaces of a gate electrode. In the SAMPLE #2 transistor, a hydrogen concentration gradation may be formed in a channel region according to positions of the spacers SP1 and SP2.

Referring to FIG. 9, the threshold voltage Vat of a transistor may be affected by the channel length. In transistors including oxide semiconductor layers of the same width or length, the threshold voltage Vth of a transistor having a relatively longer channel length or effective channel length may not decrease, thereby preventing leakage current.

In addition, compared with the SAMPLE #1 transistor, in the SAMPLE #2 transistor in which a hydrogen concentration gradation is formed in an oxide semiconductor layer due to the spacers SP1 and SP2, it can be seen that even if the length of the channel region is reduced, the threshold voltage Vth does not drop remarkably. In the SAMPLE #1 transistor, the threshold voltage Vth is about −3V when the length of the channel region is 4 µm. On the other hand, in the SAMPLE #2 transistor, the threshold voltage Vth is about −0.5 V when the length of the channel region 4 µm. As apparent from this example, since the spacers SP1 and SP2 are disposed on side surfaces of a gate electrode of an oxide transistor, a reduction in the threshold voltage Vth can be prevented even if the length of the channel region is shortened, and the oxide transistor can have excellent characteristics as a switching transistor.

The display device 1 according to the embodiment further includes the spacers SP disposed on side surfaces of the gate electrode 142 of the second transistor T2 which is an oxide transistor. Therefore, even if the width of the first oxide semiconductor layer 135 is reduced, a sufficient effective channel length can be secured. In an embodiment, in the second transistor T2 which is a switching transistor included in the display device 1, the width W2 which indicates a channel length of the channel region 135c may have a value of 3 µm or less.

Even if the channel region 135c of the first oxide semiconductor layer 135 has a small width W2, since the channel region 135c includes the regions P1 through P5 having different hydrogen concentrations, it is possible to prevent a reduction in threshold voltage due to a reduction in channel length. The display device 1 includes switching transistors having excellent characteristics. Therefore, the display panel 10 may include a greater number of pixels per unit area, and a high-resolution display device can be realized.

Referring again to FIGS. 4 through 8, the second interlayer insulating layer ILD2 is disposed on the third conductive layer 140 and the spacers SP1 and SP2. The second interlayer insulating layer ILD2 may not only cover upper surfaces of the third conductive layer 140 and the spacers SP1 and SP2 excluding parts in which the contact holes CNT1 through CNT4 are formed, but may also cover side surfaces of the spacers SP1 and SP2. The second interlayer insulating layer ILD2 may be substantially disposed over the entire surface of the substrate 101.

The second interlayer insulating layer ILD2 may include a silicon compound, a metal oxide, or the like. For example, the second interlayer insulating layer ILD2 may include silicon oxide ($SiO_x$), silicon nitride ($SiN_x$), silicon oxynitride ($SiO_xN_y$), aluminum oxide ($AlO_x$), tantalum oxide ($TaO_x$), hafnium oxide ($HfO_x$), zirconium oxide ($ZrO_x$), or titanium oxide ($TiO_x$). The second interlayer insulating layer ILD2 may have a single layer structure that includes any one of the above materials or may have a multilayer structure that includes two or more layers.

The fourth conductive layer 150 is disposed on the second interlayer insulating layer ILD2. The fourth conductive layer 150 is a data conductive layer and may include a first source/drain electrode 151 and a second source/drain electrode 152 of a transistor disposed in the silicon transistor area AR1 and the third source/drain electrode 153 and the fourth source/drain electrode 154 of a transistor disposed in the oxide transistor area AR2.

In the transistor disposed in the silicon transistor area AR1, the first source/drain electrode 151 may be electrically connected to the first source/drain region 105a of the first semiconductor layer 105 through a first contact hole CNT1 formed through the second interlayer insulating layer ILD2, the third gate insulating layer GI3, the first interlayer insulating layer ILD1, the second gate insulating layer GI2 and the first gate insulating layer GI1 to expose the first source/drain region 105a of the first semiconductor layer 105. The second source/drain electrode 152 may be electrically connected to the second source/drain region 105b of the first semiconductor layer 105 through a second contact hole CNT2 formed through the second interlayer insulating layer ILD2, the third gate insulating layer GI3, the first interlayer insulating layer ILD1, the second gate insulating layer GI2 and the first gate insulating layer GI1 to expose the second source/drain region 105b of the first semiconductor layer 105.

In the transistor disposed in the oxide transistor area AR2, the third source/drain electrode 153 may be electrically connected to the third source/drain region 135a of the first oxide semiconductor layer 135 through a third contact hole CNT3 formed through the second interlayer insulating layer ILD2 and the third gate insulating layer GI3 to expose the third source/drain region 135a of the first oxide semiconductor layer 135. The fourth source/drain electrode 154 may be electrically connected to the fourth source/drain region 135b of the first oxide semiconductor layer 135 through a fourth contact hole CNT4 formed through the second interlayer insulating layer ILD2 and the third gate insulating layer GI3 to expose the fourth source/drain region 135b of the first oxide semiconductor layer 135. The first through fourth contact holes CNT1 through CNT4 may be formed by a single mask process. In this case, a process of forming a plurality of contact holes (the first through fourth contact holes, CNT1 through CNT4) in the silicon transistor area AR1 and the oxide transistor area AR2 may be performed at the same time, process efficiency may be improved, and process cost may be reduced.

The fourth conductive layer 150 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The first via layer VIA1 is disposed on the fourth conductive layer 150. The first via layer VIA1 may include an inorganic insulating material or an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCB).

The first via layer VIA1 may be disposed on the second interlayer insulating layer ILD2 to completely cover an upper surface of the second interlayer insulating layer ILD2 except contact holes form through the first via layer VIA1. The first via layer VIA1 may include an organic layer to planarize an upper surface.

The fifth conductive layer 160 is disposed on the first via layer VIA1. The fifth conductive layer 160 may include an anode connection electrode 161. In the first via layer VIA1, a fifth contact hole CNT5 exposing the second source/drain electrode 152 of a transistor disposed in the silicon transistor area AR1 may be disposed, and the anode connection electrode 161 may be connected to the second source/drain electrode 152 through the fifth contact hole CNT5.

The fifth conductive layer 160 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second via layer VIA2 is disposed on the anode connection electrode 161. The second via layer VIA2 may include an inorganic insulating material or an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCB).

The anode ANO is disposed on the second via layer VIA2. The anode ANO may be a pixel electrode disposed separately for each pixel. The anode ANO may be electrically connected to the anode connection electrode 161 through a sixth contact hole CNT6 formed through the second via layer VIA2 and exposing a part of the anode connection electrode 161.

The anode ANO may have a stacked structure in which a material layer having a high work function such as indium tin oxide (ITO), indium zinc oxide (IZO), zinc oxide (ZnO) or indium oxide ($In_2O_3$) and a reflective material layer such as silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca) or a mixture of the same are stacked. The material layer having a high work function may be disposed on the reflective material layer and thus disposed close to the light emitting layer EL. The anode ANO may have a multilayer structure of ITO/Mg, ITO/MgF, ITO/Ag or ITO/Ag/ITO, but the disclosure is not limited thereto.

The pixel defining layer PDL may be disposed on the anode ANO. The pixel defining layer PDL may include an opening that partially exposes the anode ANO. The pixel defining layer PDL may include an organic insulating material or an inorganic insulating material. For example, the pixel defining layer PDL may include at least one of polyimide resin, acrylic resin, a silicone compound, and polyacrylic resin.

The light emitting layer EL is disposed on the anode ANO exposed by the pixel defining layer PDL. The light emitting layer EL may include an organic material layer. The organic material layer of the light emitting layer EL may include an organic light emitting layer and may further include a hole injection/transport layer and/or an electron injection/transport layer.

The cathode CAT may be disposed on the light emitting layer EL. The cathode CAT may be a common electrode entirely disposed in the display area DA without distinction between the pixels PX. The anode ANO, the light emitting layer EL, and the cathode CAT may constitute an organic light emitting element.

The cathode CAT may include a material layer having a low work function, such as Li, Ca, LiF/Ca, LiF/Al, Al, Mg, Ag, Pt, Pd, Ni, Au Nd, Ir, Cr, BaF, Ba, or a compound or mixture of the same (e.g., a mixture of Ag and Mg). The cathode CAT may further include a transparent metal oxide layer disposed on the material layer having a low work function.

The anode ANO, the light emitting layer EL, and the cathode CAT may constitute the organic light emitting element OLED.

The thin-film encapsulation layer 170 is disposed on the cathode CAT. The thin-film encapsulation layer 170 may include a first inorganic layer 171, an organic layer 172, and a second inorganic layer 173. The first inorganic layer 171 and the second inorganic layer 173 may contact each other at an end of the thin-film encapsulation layer 170. The organic layer 172 may be sealed by the first inorganic layer 171 and the second inorganic layer 173.

Each of the first inorganic layer 171 and the second inorganic layer 173 may include silicon nitride, silicon oxide, or silicon oxyniinde. The organic layer 172 may include an organic insulating material.

A process of fabricating the display device 1 will now be described with further reference to other drawings.

Figure 10:
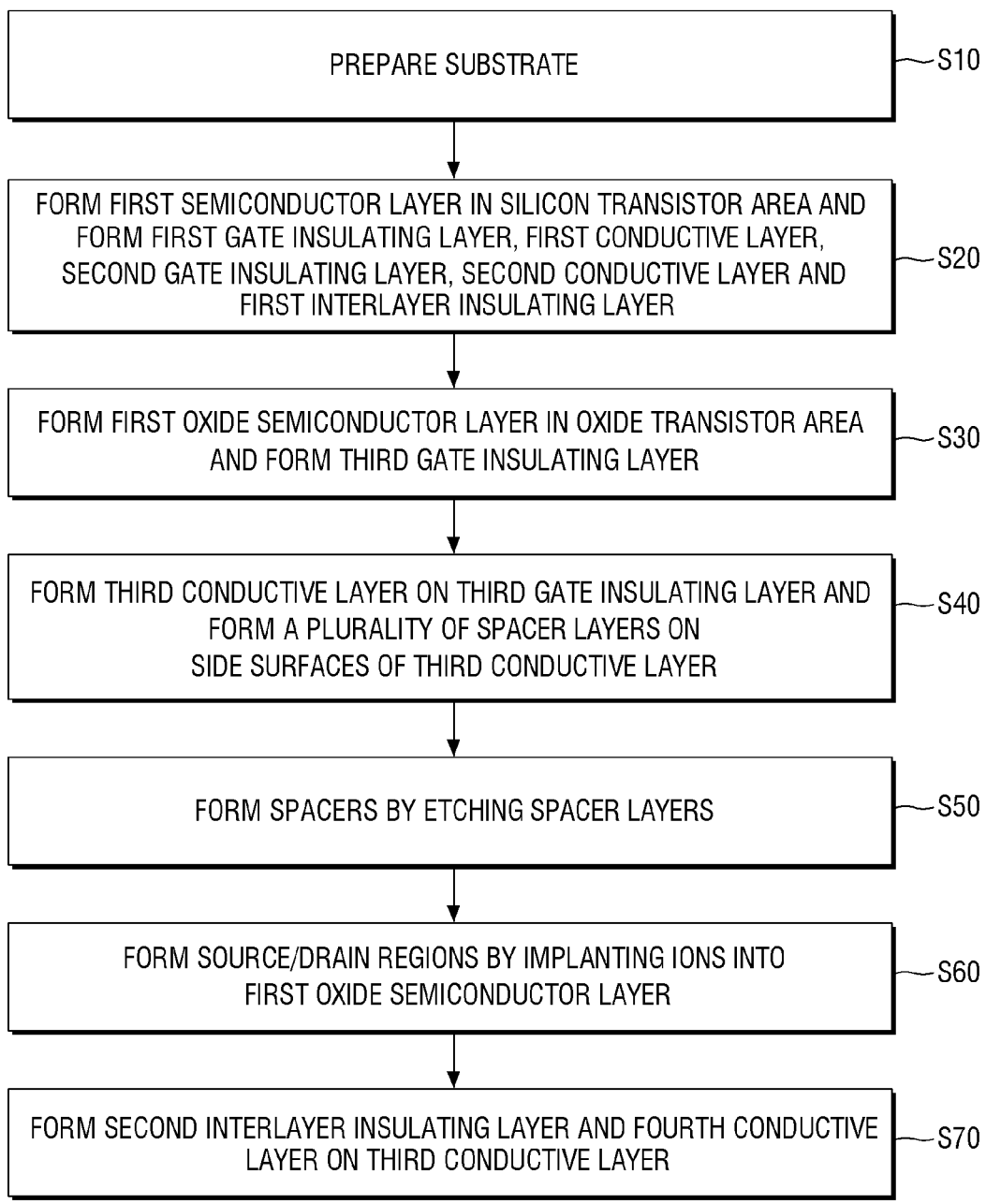
FIG. 10 is a flowchart illustrating a process of fabricating a display device according to an embodiment.

FIG. 10 is a flowchart illustrating a process of fabricating a display device according to an embodiment.

Referring to FIG. 10, the process of fabricating the display device 1 according to the embodiment may include preparing a substrate 101 (operation S10), forming a first semiconductor layer 105 in a silicon transistor area AR1 and forming a first gate insulating layer GI1 on the first semiconductor layer 105, a first conductive layer 110 on the first gate insulating layer GI1, a second gate insulating layer GI2 on the first conductive layer 110, a second conductive layer 120 on the second gate insulating layer GI2 and a first interlayer insulating layer ILD1 on the second conductive layer 120 (operation S20), forming a first oxide semiconductor layer 135 in an oxide transistor area AR2 and forming a third gate insulating layer GI3 on the first oxide semiconductor layer 135 (operation S30), forming a third conductive layer 140 on the third gate insulating layer GI3 and forming a plurality of spacer layers SPL1 and SPL2 on side surfaces of the third conductive layer 140 (operation S40), forming spacers SP by etching the spacer layers SPL1 and SPL2 (operation S50), forming source/drain regions 135a and 135b by implanting ions into the first oxide semiconductor layer 135 (operation S60), and forming a second interlayer insulating layer ILD2 and a fourth conductive layer 150 on the third conductive layer 140 (operation S70). The process of fabricating the display device 1 may include a process of forming a first transistor T1 including the first semiconductor layer 105 in the silicon transistor area AR1 and a process of forming a second transistor T2 including the first oxide semiconductor layer 135 in the oxide transistor area AR2. In the process of forming the second transistor T2, spacers SP1 and SP2 may be formed on the first oxide semiconductor layer 135, and then an ion implantation process may be performed. Accordingly, the second transistor T2 may secure a sufficient effective channel length. The process of fabricating the display device 1 will now be described in detail with further reference to other drawings.

Figure 11:
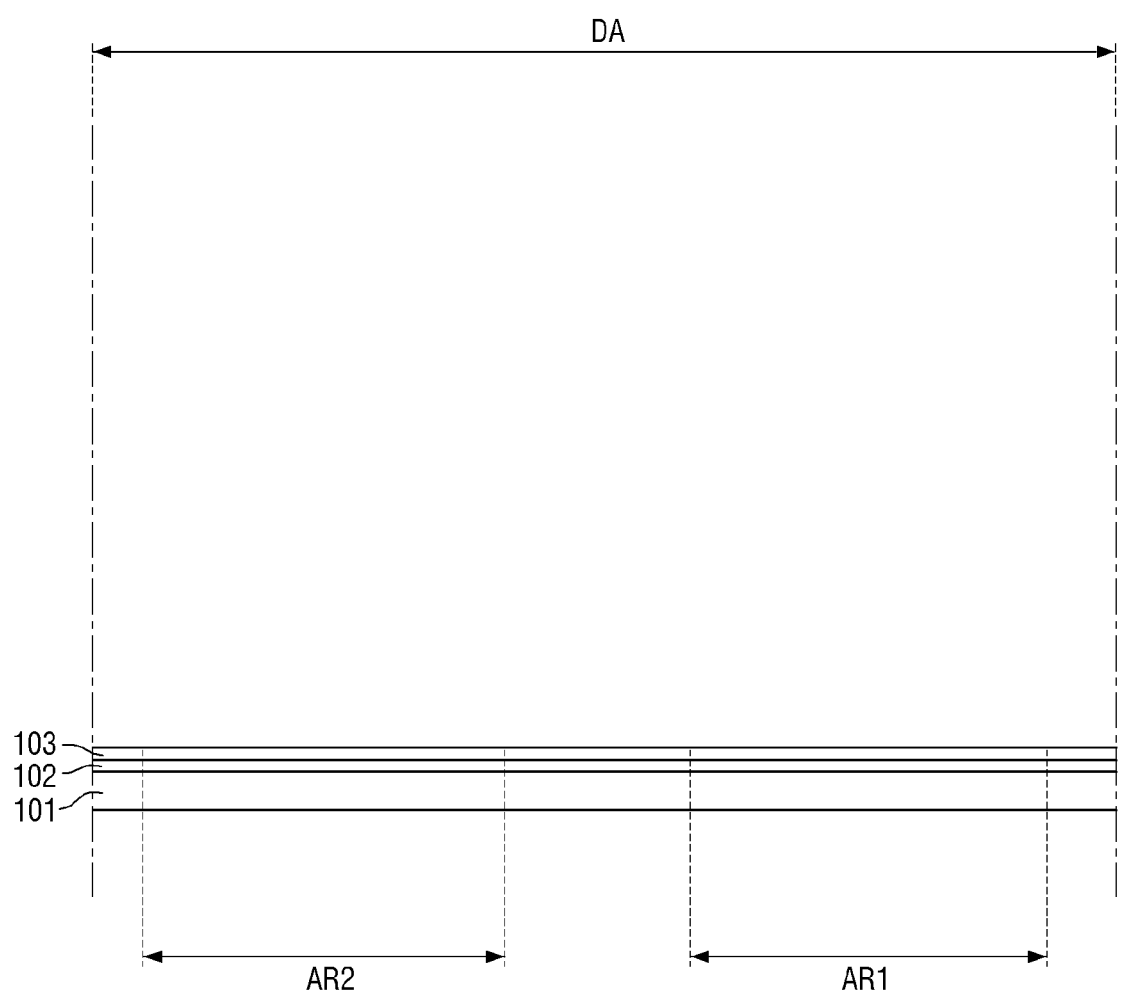
FIGS. 11, 12 and 13 are cross-sectional views sequentially illustrating a part of a process of forming a first transistor during a process of fabricating a display device according to an embodiment.
Figure 12:
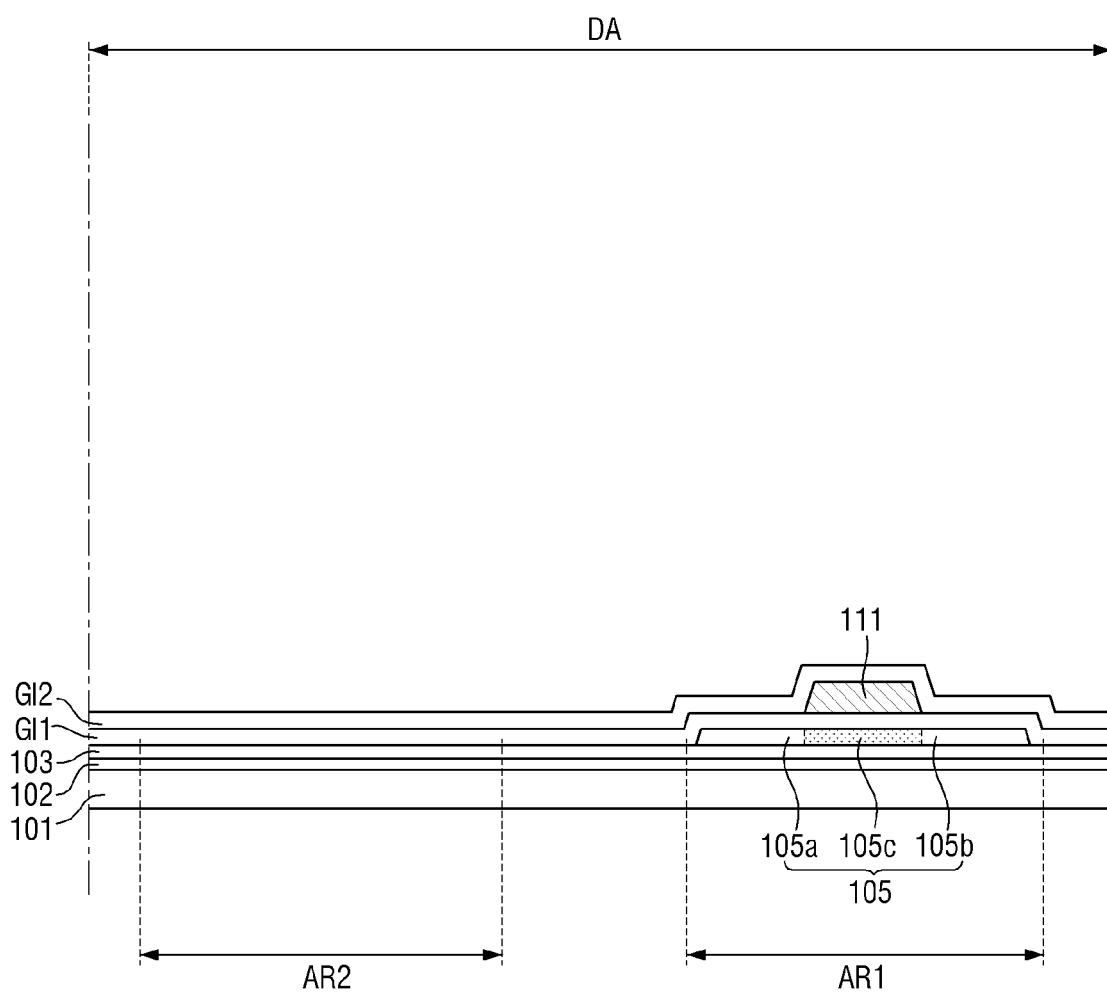
Figure 13:
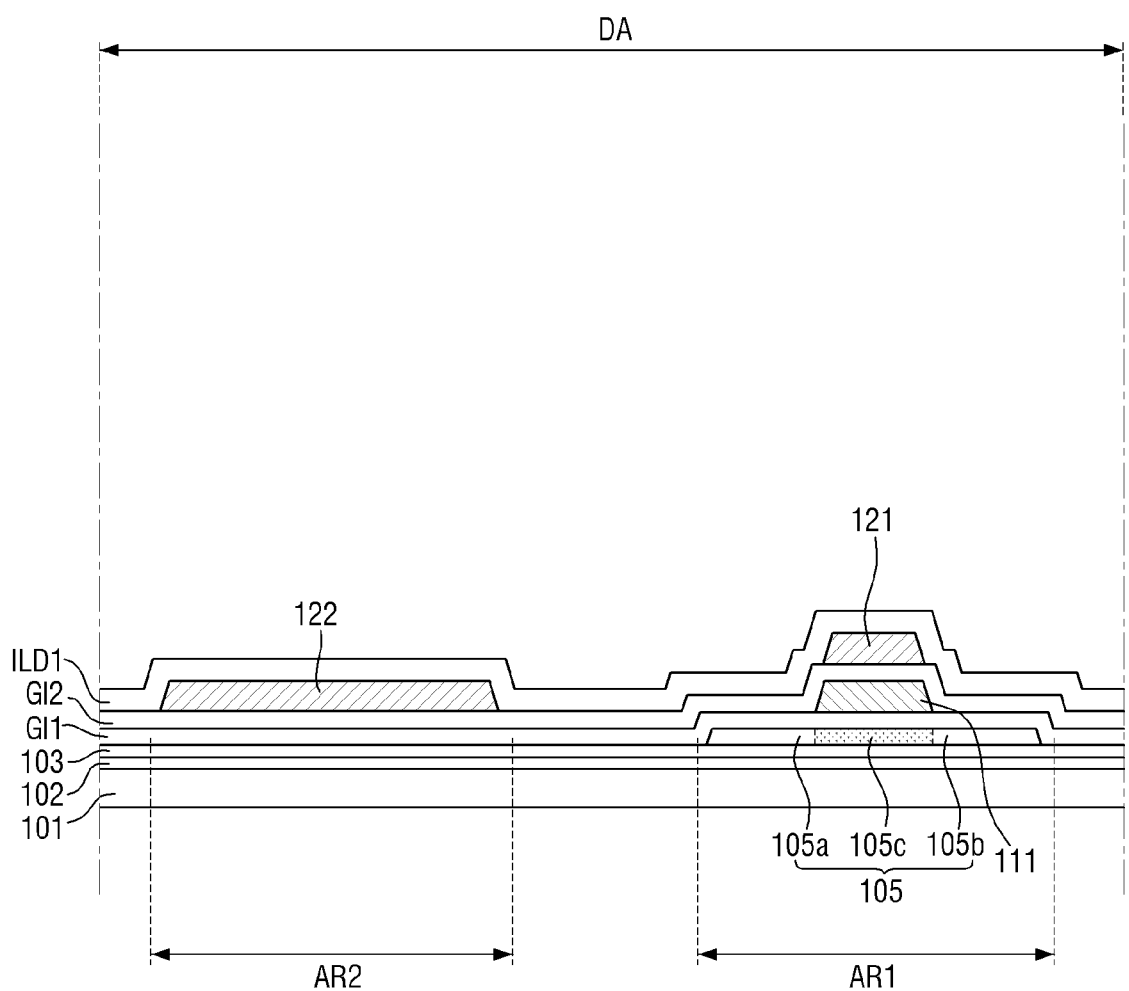

FIGS. 11 through 13 are cross-sectional views sequentially illustrating a part of a process of forming a first transistor during a process of fabricating a display device according to an embodiment.

Referring to FIGS. 11 through 13, a substrate 101 on which the barrier layer 102 and the buffer layer is disposed is prepared (operation S10), and a first semiconductor layer 105 and a first gate electrode 111 of a first transistor T1 are formed in a silicon transistor area AR1.

As illustrated in FIG. 11, the substrate 101 may include the silicon transistor area AR1 and an oxide transistor area AR2. A barrier layer 102 and a buffer layer 103 may be sequentially disposed on the substrate 101. This is the same as described above.

Next, as illustrated in FIG. 12, the first semiconductor layer 105 is formed on the buffer layer 103 in the silicon transistor area AR1, and then a first gate insulating layer GI1, a first conductive layer 110 (111), and a second gate insulating layer GI2 are sequentially formed (operation S20). The first semiconductor layer 105 may be formed by forming a material layer for a silicon semiconductor layer and then patterning the material layer through a photolithography process. The first gate insulating layer GI1 and the second gate insulating layer GI2 may be formed by entirely depositing a material layer for a gate insulating layer. Alternatively, in some embodiments, the first gate insulating layer GI1 and the second gate insulating layer GI2 may be formed by entirely depositing a material layer for a gate insulating layer and then patterning the material layer, and the first gate insulating layer GI1 and the second gate insulating layer GI2 may also be patterned.

Next, as illustrated in FIG. 13, a second conductive layer 120 and a first interlayer insulating layer ILD1 are formed on the second gate insulating layer GI2 (operation S20). The second conductive layer 120 may include a second electrode 121 of a capacitor Cst disposed in the silicon transistor area AR1 and a bottom light-blocking pattern 122 disposed in the oxide transistor area AR2. The second conductive layer 120 may be formed by entirely depositing a material layer for a conductive layer and then patterning the material layer through a photolithography process.

Next, a first oxide semiconductor layer 135 and a second gate electrode 142 of a second transistor T2 and spacers SP1 and SP2 are formed in the oxide transistor area AR2.

FIGS. 14 through 20 are cross-sectional views sequentially illustrating a part of a process of forming a second transistor during the process of fabricating the display device according to the embodiment.

Referring to FIGS. 14 through 20, the first oxide semiconductor layer 135, the third gate insulating layer GI3, the second gate electrode 142, and the spacers SP1 and SP2 are formed in the oxide transistor area AR2 of the substrate 101.

Figure 14:
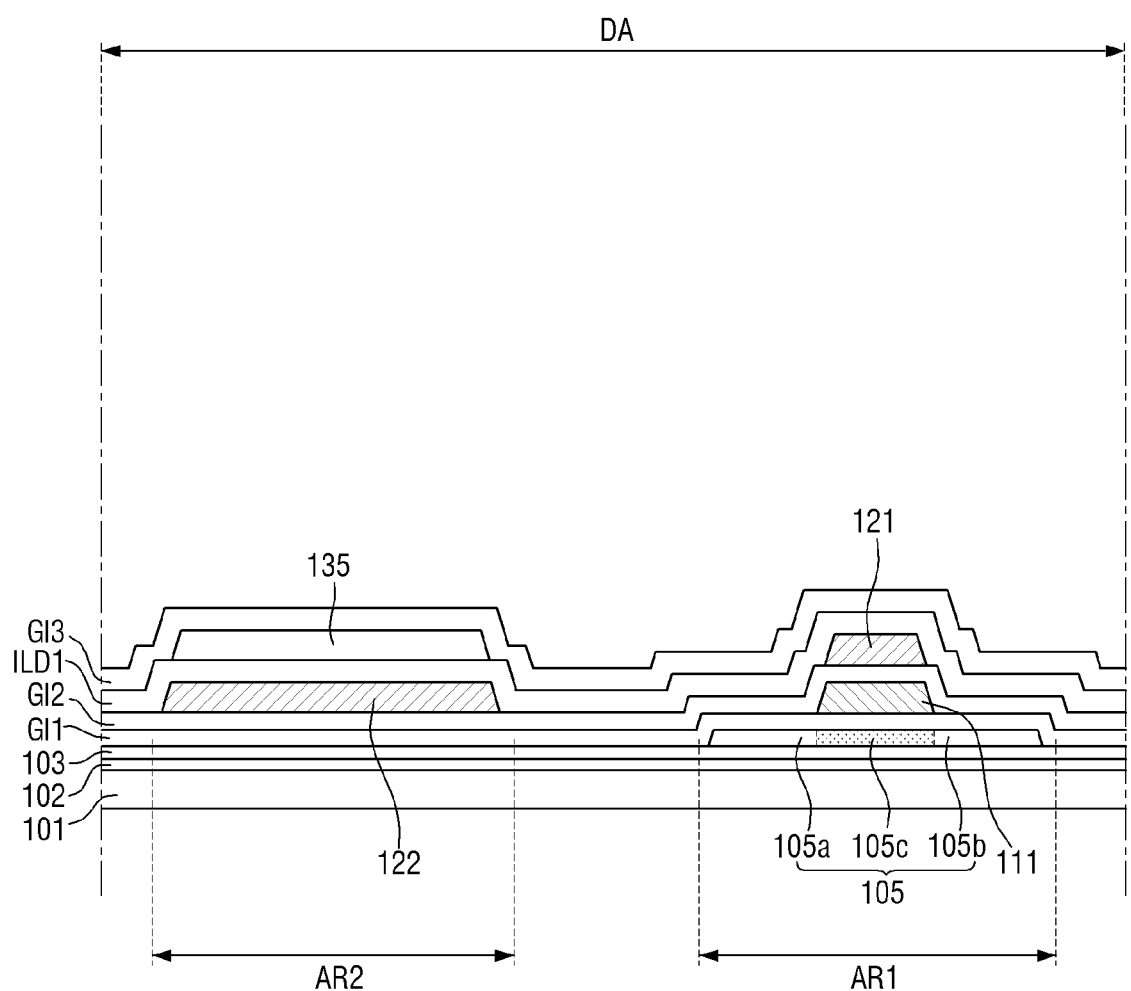
FIGS. 14, 15, 16, 17, 18, 19 and 20 are cross-sectional views sequentially illustrating a part of a process of forming a second transistor during the process of fabricating the display device according to the embodiment.

As illustrated in FIG. 14, the first oxide semiconductor layer 135 is formed on the second gate insulating layer GI2 of the oxide transistor area AR2, and then a third gate insulating layer GI3 is formed on the first oxide semiconductor layer 135 (operation S30). The first oxide semiconductor layer 135 may be formed by forming a material layer for an oxide semiconductor layer and then patterning the material layer through a photolithography process. The third gate insulating layer GI3 may be formed by entirely depositing a material layer for a gate insulating layer. In some embodiments, the third gate insulating layer GI3 may be formed by entirely depositing a material layer for a gate insulating layer and then patterning the material layer, and the third gate insulating layer GI3 may also be patterned.

Figure 15:
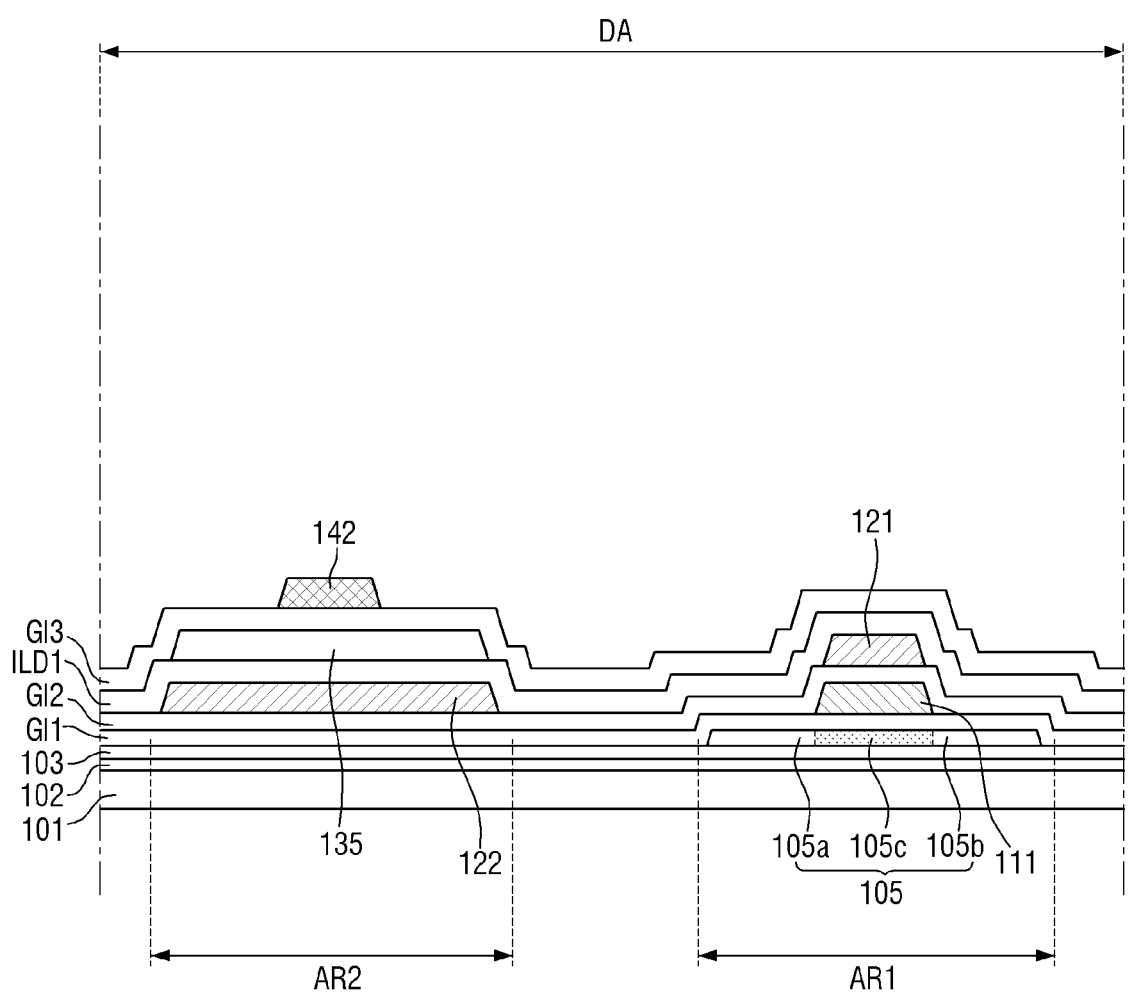

Next, as illustrated in FIG. 15, a third conductive layer 140 is formed on the third gate insulating layer GI3. The third conductive layer 140 may include the second gate electrode 142 disposed in the oxide transistor area AR2. The third conductive layer 140 may be formed by entirely depositing a material layer for a conductive layer and then patterning the material layer through a photolithography process.

Figure 16:
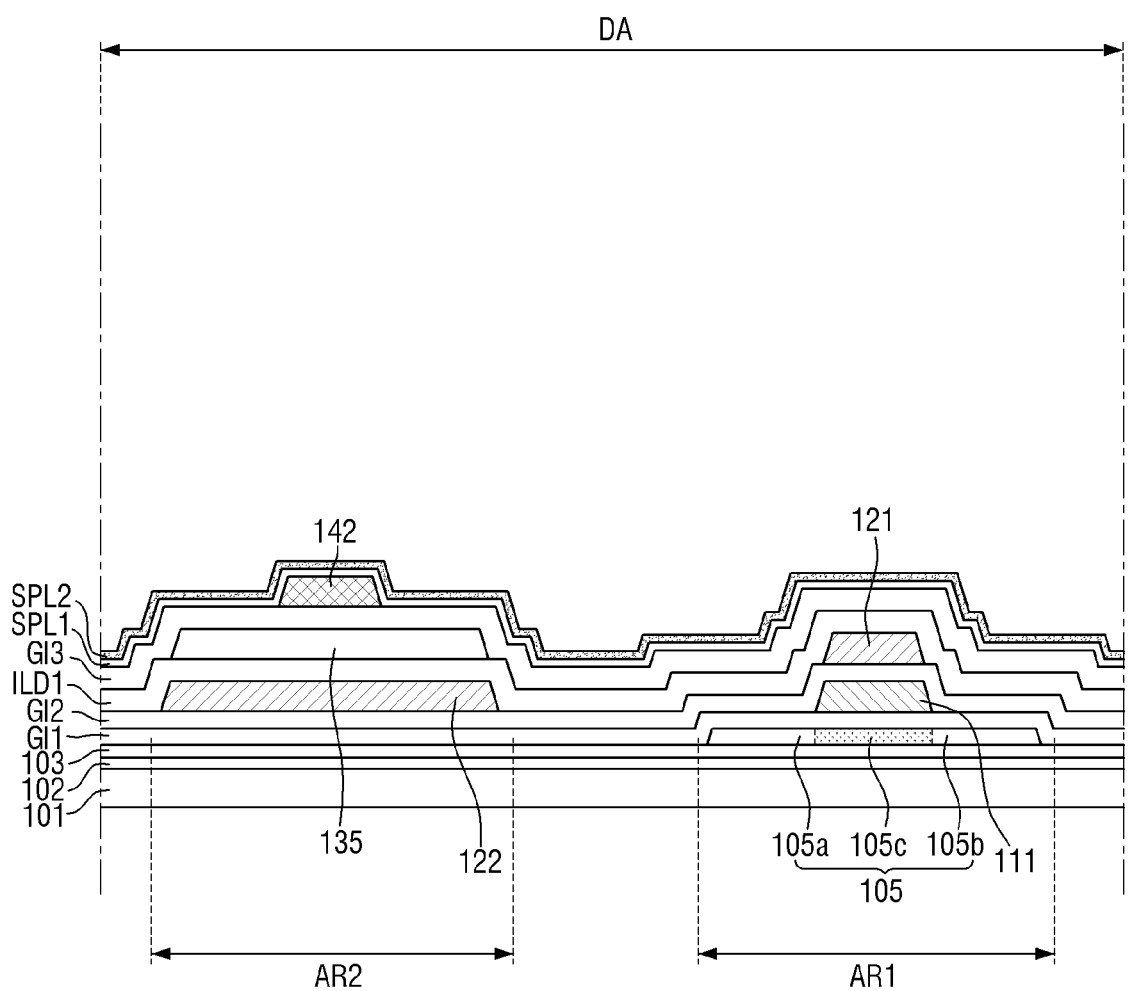

Next, as illustrated in FIG. 16, a plurality of spacer layers SPL1 and SPL2 are formed on the third conductive layer 140 (operation S40). The spacer layers SPL1 and SPL2 may be entirely disposed on the third conductive layer 140 and the third gate insulating layer GI3. The spacer layers SPL1 and SPL2 may include a first spacer layer SPL1 directly disposed on the third conductive layer 140 (142) and the third gate insulating layer GI3 and a second spacer layer SPL2 directly disposed on the first spacer layer SPL1. The first spacer layer SPL1 may include an ultra-low hydrogen film material and may be patterned in a subsequent process to form a first spacer SP1. The second spacer layer SPL2 may include a low hydrogen film material and may be patterned in a subsequent process to form a second spacer SP2. The spacer layers SPL1 and SPL2 may be formed by entirely depositing a material layer for a spacer layer.

Figure 17:
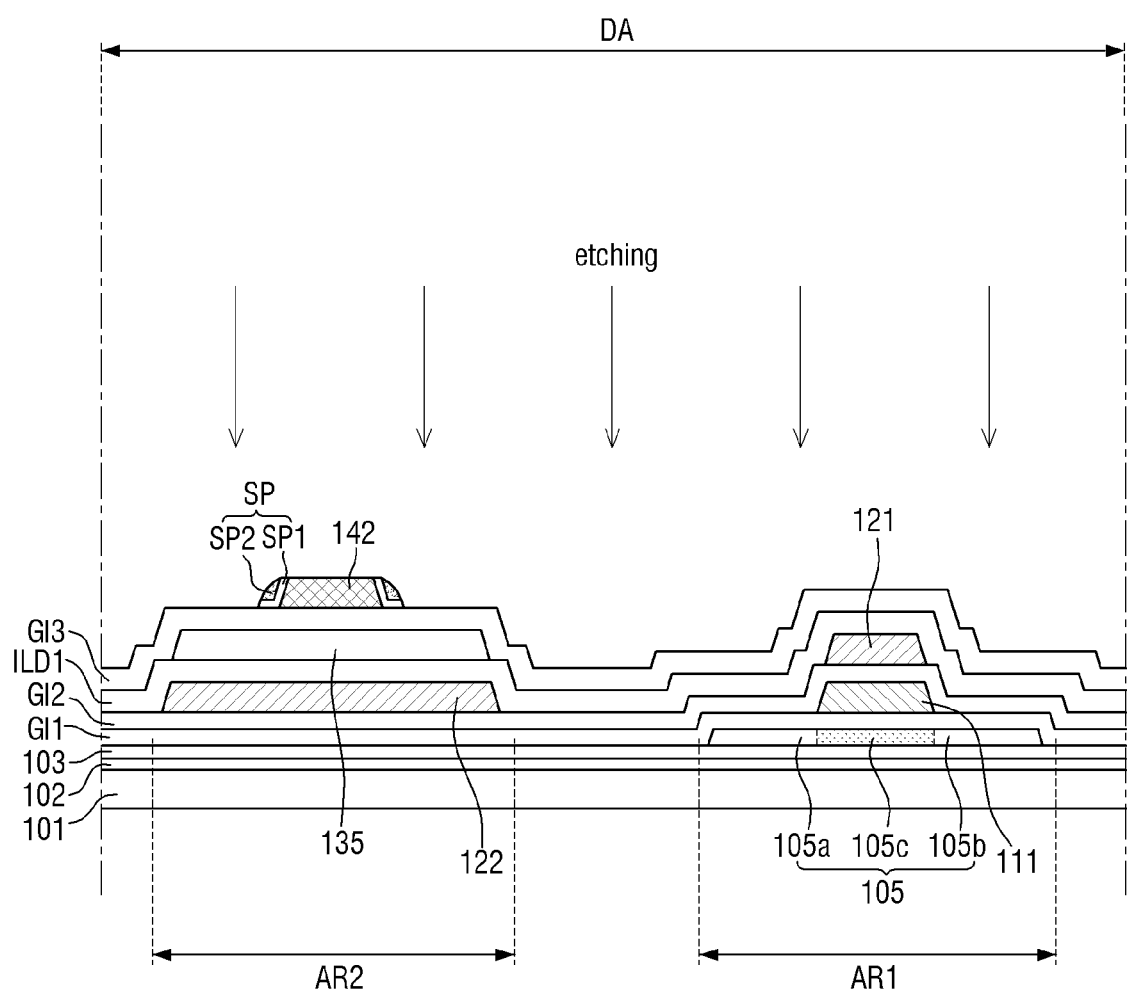

Next, as illustrated in FIG. 17, the spacers SP1 and SP2 are formed by etching the spacer layers SPL1 and SPL2 without a mask, for example, through an etch back process (operation S50). The etching of the spacer layers SPL1 and SPL2 may be performed by a process of removing the spacer layers SPL1 and SPL2 on the second gate electrode 142 and on the third gate insulating layer GI3 to expose most of an upper surface of the second gate electrode 142 and an upper surface of the third gate insulating layer GI3. When most of the spacer layers SPL1 and SPL2 are removed, the spacers SP1 and SP2 disposed on side surfaces of the second gate electrode 142 may remain. The first spacer layer SPL1 formed first may form the first spacer SP1 in direct contact with the side surfaces of the second gate electrode 142 and the third gate insulating layer GI3, and the second spacer layer SPL2 may form the second spacer SP2 disposed on the first spacer SP1.

In an embodiment, the process of removing the spacer layers SPL1 and SPL2 may be performed by a dry etch-back process. A separate mask is not required for the etching of the spacer layers SPL1 and SPL2, and the spacers SP1 and SP2 formed by the etching of the spacer layers SPL1 and SPL2 may have a curved outer surface as described above.

Figure 18:
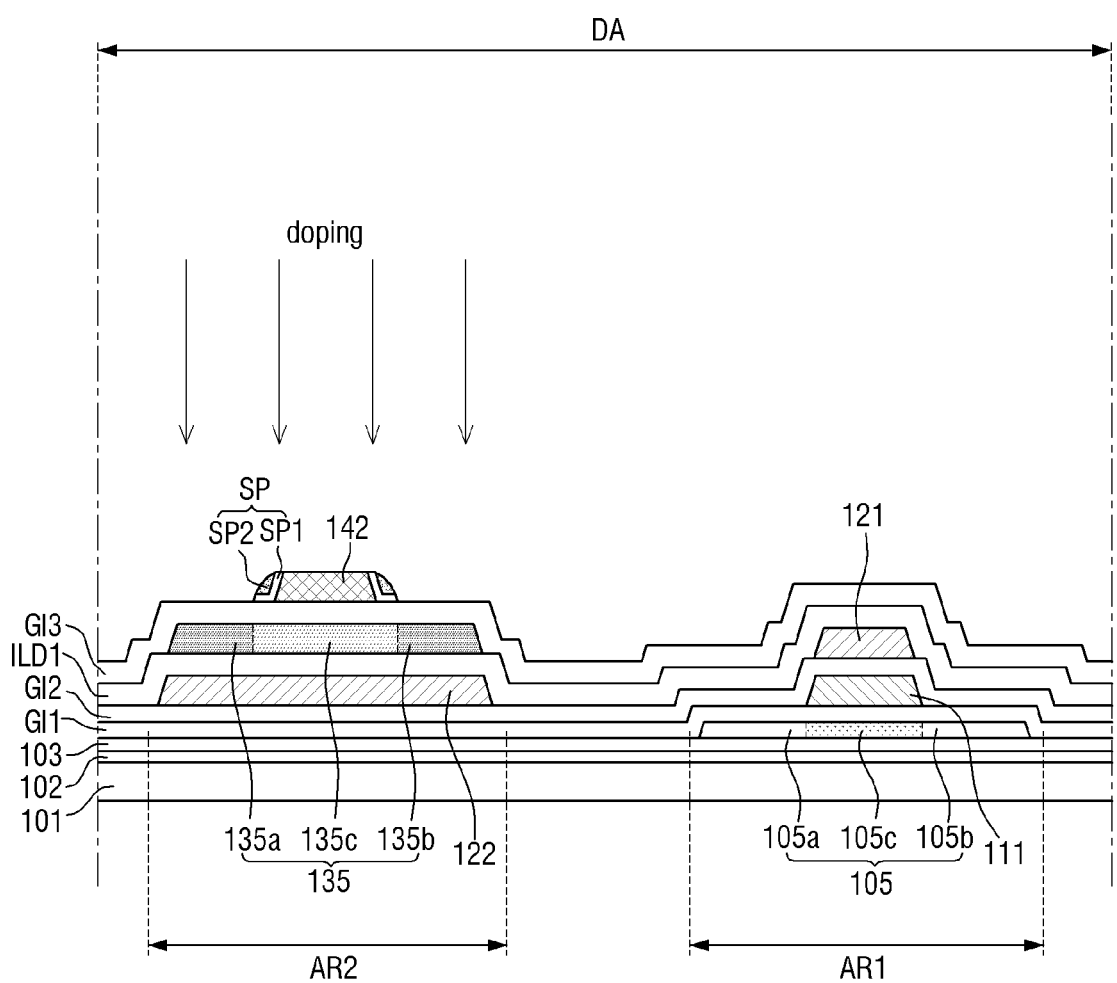

Next, as illustrated in FIG. 18, source/drain regions 135a and 135b and a channel region 135c of the first oxide semiconductor layer 135 are formed by implanting or doping ions into the first oxide semiconductor layer 135. Ions may be implanted into regions of the first oxide semiconductor layer 135 which do not overlap with the second gate electrode 142 and the spaces SP1 and SP2. Thus, the source/drain regions 135a and 135b may become conductive. The conductive regions may form a third source/drain region 135a and a fourth source/drain region 135b, respectively. Ions may not be implanted into a region of the first oxide semiconductor layer 135 which overlaps with the second gate electrode 142 and the spacers SP1 and SP2. Thus, the channel region 135c may be formed. The spacers SP1 and SP2 may prevent ions frorrr being implanted, and the channel region 135c of the first oxide semiconductor layer 135 may have a greater length than the width of the second gate electrode 142.

Figure 19:
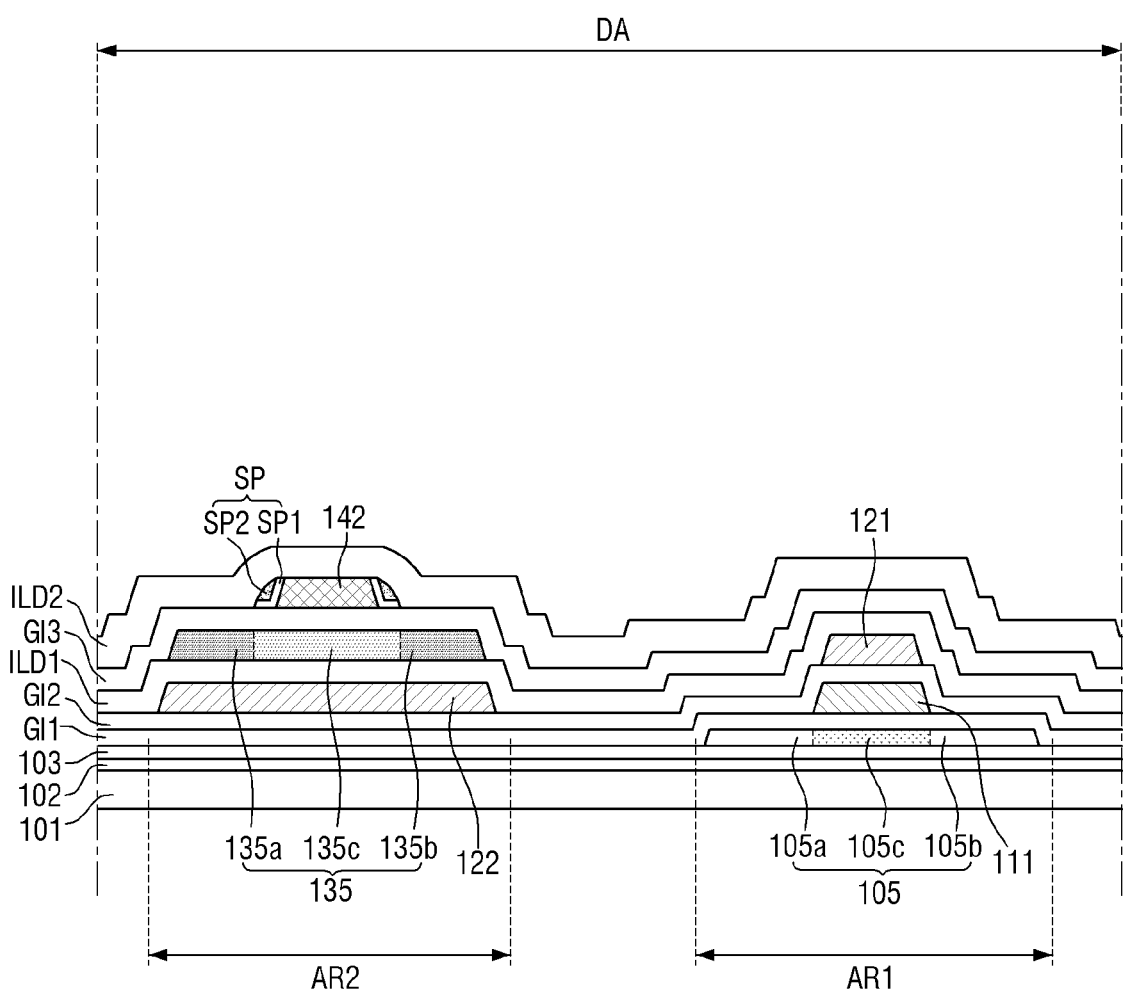
Figure 20:
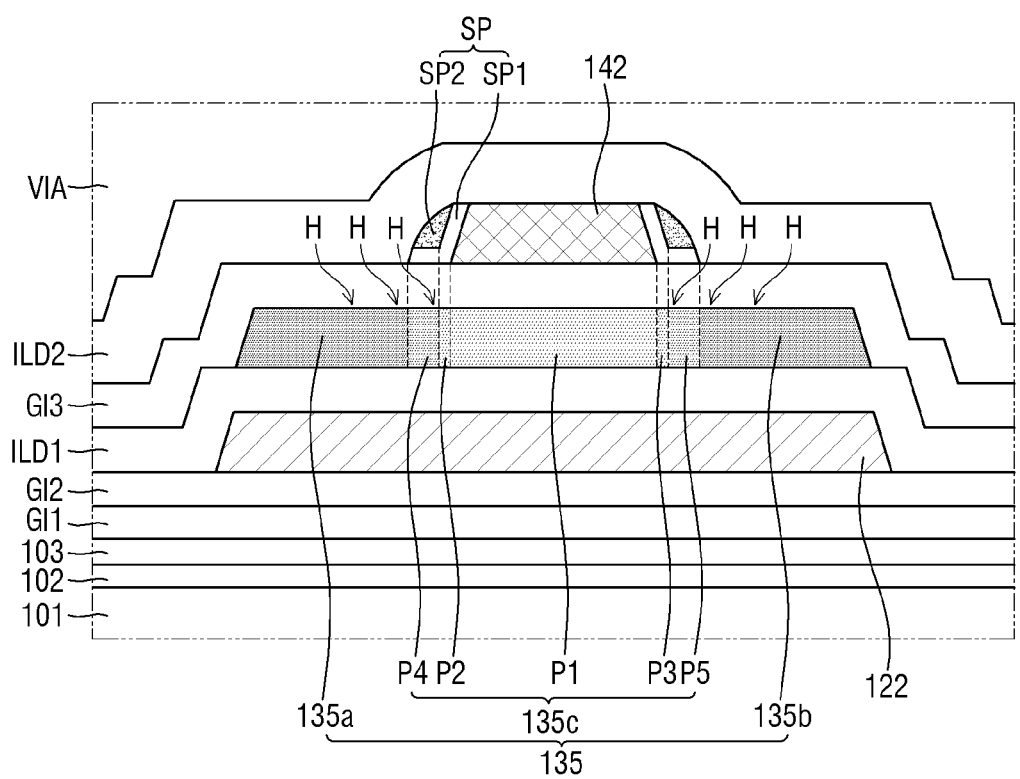

Next, referring to FIGS. 19 and 20, a second interlayer insulating layer ILD2 is formed on the third conductive layer 140. The second interlayer insulating layer ILD2 may be formed by entirely depositing a material layer for an interlayer insulating layer. The second interlayer insulating layer ILD2 may include a high hydrogen film material having a higher hydrogen content than each of the spacers SP1 and SP2. After the second interlayer insulating layer ILD2 is formed, hydrogen (H) included in the second interlayer insulating layer ILD2 may be diffused to the first oxide semiconductor layer 135 through the third gate insulating layer GI3. However, the spacers SP1 and SP2 may serve to control diffusion of hydrogen, and regions P1 through P5 having different hydrogen concentrations according to where they overlap the spacers SP1 and SP2 and the second gate electrode 142 may be formed in the channel region 135c of the first oxide semiconductor layer 135. A first region P1 may have the lowest hydrogen concentration, and a second region P2 and a third region P3 may have a higher hydrogen concentration than the first region P1. A fourth region P4 and a fifth region P5 may have a higher hydrogen concentration than the second region P2 and the third region P3. In the first oxide semiconductor layer 135, a hydrogen concentration gradation may be formed in the channel region 135c.

Figure 21:
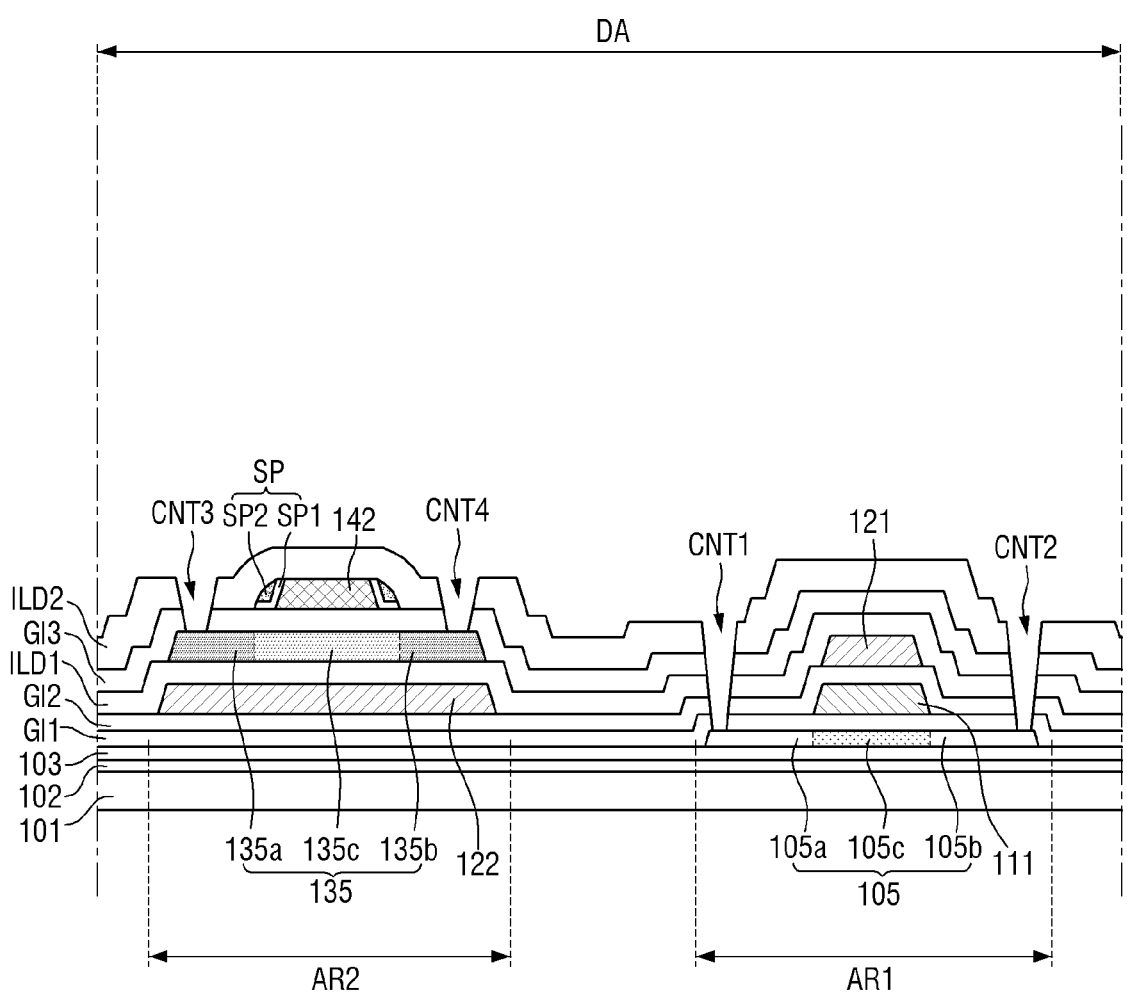
FIGS. 21 and 22 are cross-sectional views sequentially illustrating a part of the process of fabricating the display device according to the embodiment.
Figure 22:
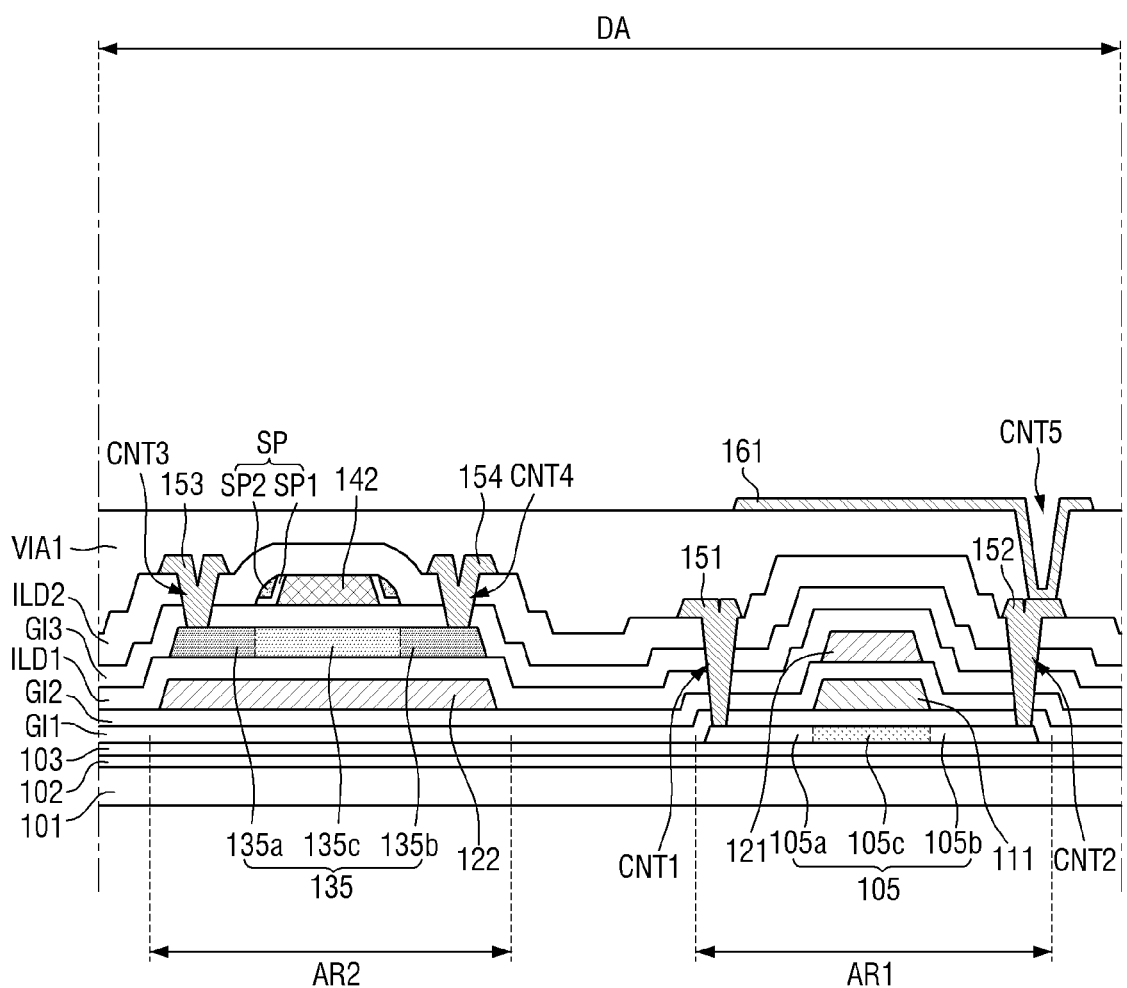

FIGS. 21 and 22 are cross-sectional views sequentially illustrating a part of the process of fabricating the display device according to the embodiment.

Referring to FIGS. 21 and 22, contact holes CNT1 through CNT4 are formed through at least a part of the first gate insulating layer GI1, the second gate insulating layer GI2, the first interlayer insulating layer ILD1 and the second interlayer insulating layer ILD2, and a fourth conductive layer 150 is formed (operation S70). The contact holes CNT1 through CNT4 may be formed through an etching process for etching a plurality of layers. Even during the process of forming the contact holes CNT1 through CNT4 and a subsequent beat treatment process, hydrogen included in the second interlayer insulating layer ILD2 may be diffused to the first oxide semiconductor layer 135 through the third gate insulating layer GI3.

After the contact holes CNT1 through CNT4 are formed, the fourth conductive layer 150 is formed on the second interlayer insulating layer ILD2. The fourth conductive layer 150 may include first and second source/drain electrodes 151 and 152 disposed in the silicon transistor area AR1 and third and fourth source/drain electrodes 153 and 154 disposed in the oxide transistor area AR2. The fourth conductive layer 150 may be formed by entirely depositing a material layer for a conductive layer and then pattering the material layer through a photolithography process.

Next, a first via layer VIA1 disposed on the fourth conductive layer 150 and an anode connection electrode 161 disposed on the first via layer VIA1 are formed. Then, although not illustrated in the drawings, a second via layer VIA2, an anode ANO, a pixel defining layer PDL, a cathode CAT, a light emitting layer EL, and a thin-film encapsulation layer 170 are formed on the anode connection electrode 161 to fabricate the display device 1.

Various embodiments of the display device 1 will now be described with further reference to other drawings.

Figure 23:
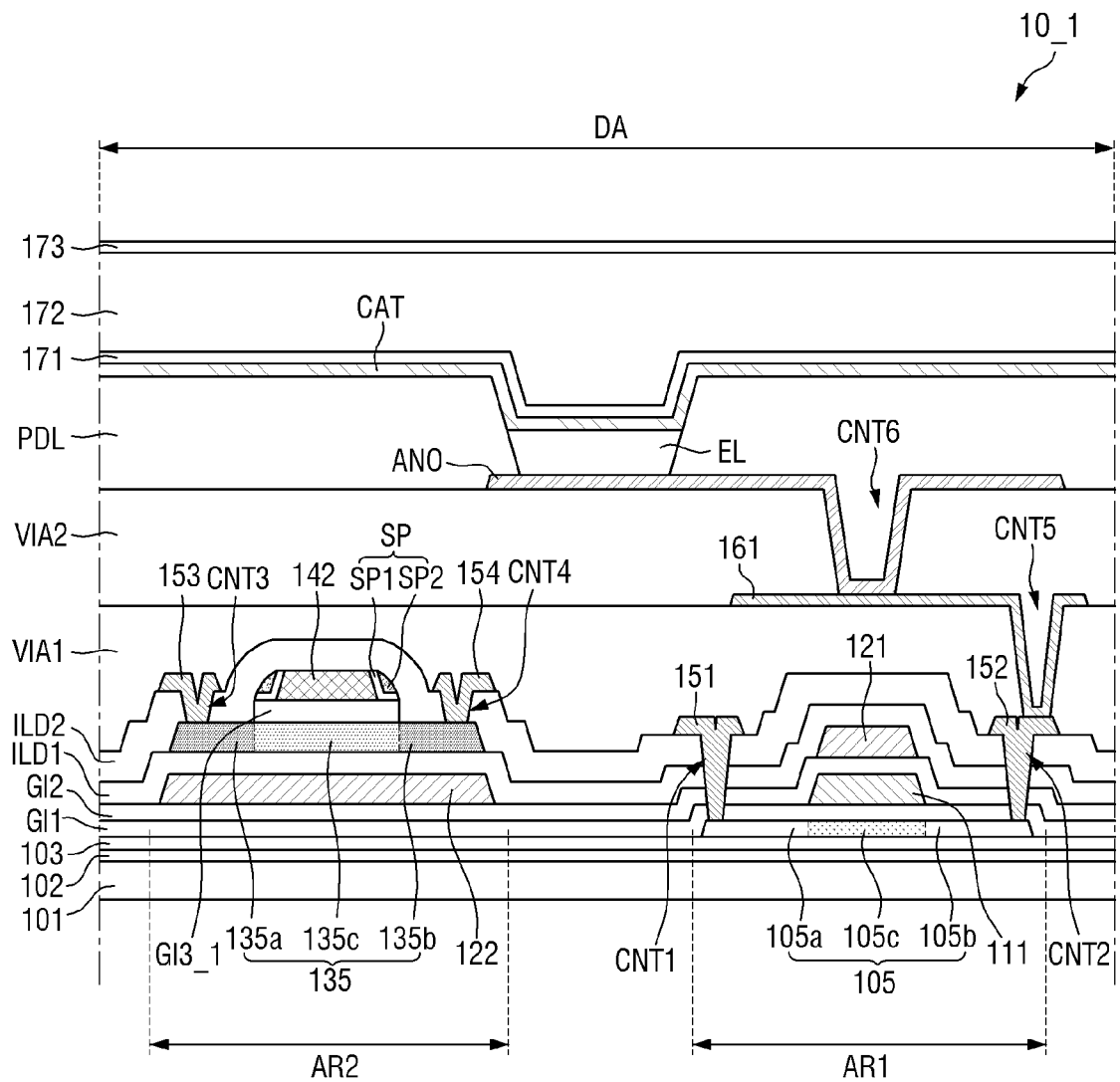
FIG. 23 is a cross-sectional view of a pixel of a display device according to an embodiment.

FIG. 23 is a cross-sectional view of a pixel of a display device 10_1 according to an embodiment.

Referring to FIG. 23, in the display device 10_1 according to the embodiment, a third gate insulating layer GI3_1 may be patterned.

The third gate insulating layer GI3_1 may be disposed on a first oxide semiconductor layer 135. However, unlike a first gate insulating layer GI1 and a second gate insulating layer GI2, the third gate insulating layer GI3_1 may be disposed only in some regions. The third gate insulating layer GI3_1 may cover a channel region 135c of the first oxide semiconductor layer 135 and may expose third and fourth source/drain regions 135a and 135b and side surfaces of the first oxide semiconductor layer 135. The third gate insulating layer GI3_1 may have substantially the same pattern shape as a second gate electrode 142 and spacers SP1 and SP2 thereon. For example, side surfaces of the third gate insulating layer GI3_1 may be aligned with side surfaces of spacers SP, and a width of the third gate insulating layer GI3_1 may be the same as the sum of widths of the second gate electrode 142 and the spacer that includes spacers SP1 and SP2. The third gate insulating layer GI3_1 may be patterned by etching a material layer for a third gate insulating layer using a third conductive layer 140 and the spacers SP1 and SP2 as a mask, but the disclosure is not limited thereto. In this case, first through fourth contact holes CNT1 through CNT4 do not pass through the third gate insulating layer GI3_1, unlike in the embodiment of FIG. 4.

Figure 24:
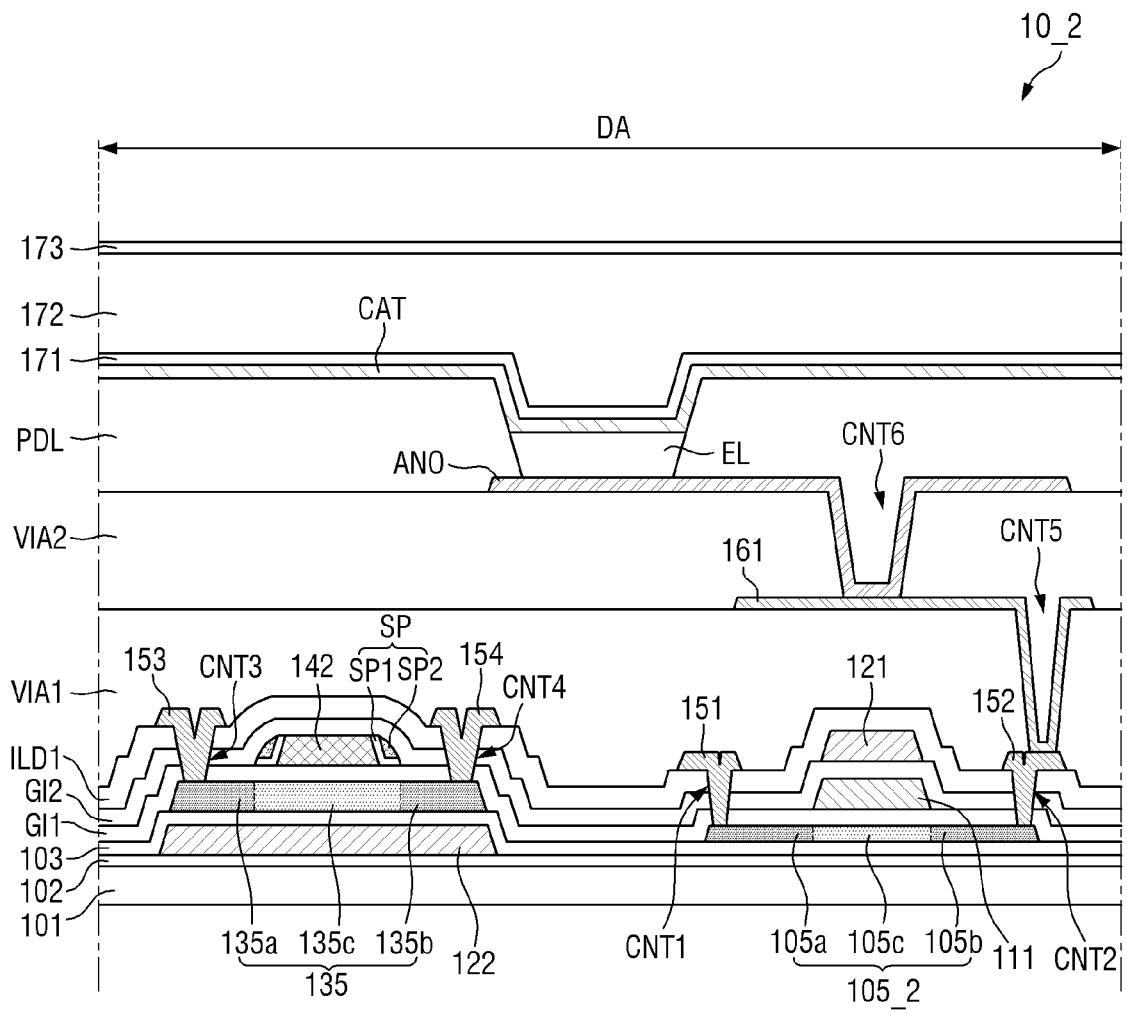
FIG. 24 is a cross-sectional view of a pixel of a display device according to an embodiment.

FIG. 24 is a cross-sectional view of a pixel of a display device 10_2 according to an embodiment.

Referring to FIG. 24, in the display device 10_2 according to the embodiment, a first transistor T1 may also be an oxide transistor including an oxide semiconductor layer 105_2. The first transistor T1 may include a second oxide semiconductor layer 105_2, and a second transistor T2 may include a first oxide semiconductor layer 135. Since each of the first transistor T1 and the second transistor T2 is formed as an oxide transistor, the first oxide semiconductor layer 135 and the second oxide semiconductor layer 105_2 may be formed on the same layer, and some of the layers disposed on a substrate 101 may be omitted. The current embodiment is different from the embodiment of FIG. 4 in that each of the first transistor T1 and the second transistor T2 includes the oxide semiconductor layer 105_2 or 135 and that some layers are omitted.

Each of the first oxide semiconductor layer 135 and the second oxide semiconductor layer 105_2 may be disposed on a buffer layer 103. The first oxide semiconductor layer 135 and the second oxide semiconductor layer 105_2 may be disposed on the same layer and may be formed in the same process. Compared with the embodiment of FIG. 4, the number of layers disposed between the first oxide semiconductor layer 135 and the substrate 101 may be reduced. A bottom light-blocking pattern 122 may be disposed between the buffer layer 103 and a barrier layer 102 to overlap the first oxide semiconductor layer 135.

A first gate insulating layer GI1 may be disposed on each of the first oxide semiconductor layer 135 and the second oxide semiconductor layer 105_2. The first gate insulating layer GI1 may cover both the first oxide semiconductor layer 135 and the second oxide semiconductor layer 105_2 disposed at different positions on the substrate 101.

A first gate electrode 111 may be disposed on the first gate insulating layer GI1 to overlap the second oxide semiconductor layer 105_2, and a second gate electrode 142 may be disposed on the first gate insulating layer GI1 to overlap the first oxide semiconductor layer 105_2. The second gate electrode 142 which is a third conductive layer 140 is disposed on the same layer as the first gate electrode 111 which is a first conductive layer 110, unlike in the embodiment of FIG. 4.

Spacers SP1 and SP2 may be disposed on the second gate insulating layer GI2 and around the second gate electrode 142. The spacers SP1 and SP2 may be disposed on side surfaces of the second gate electrode 142 of the second transistor T2 which is a switching transistor but may not be disposed on side surfaces of the first gate electrode 111 of the first transistor T1 which is a driving transistor.

A second gate insulating layer GI2 may be disposed on each of the first gate electrode 111 and the second gate electrode 142. The second gate insulating layer GI2 may be disposed to cover both the first gate electrode 111 and the second gate electrode 142 disposed at different positions on the substrate 101.

A second electrode 121 of a capacitor Cst which is a second conductive layer 120 may be disposed on the second gate insulating layer GI2 to overlap the first gate electrode 111. The second electrode 121 of the capacitor Cst may be disposed over the second gate electrode 142.

A first interlayer insulating layer ILD1 may be disposed on the second conductive layer 120, and a fourth conductive layer 150 may be disposed on the first interlayer insulating layer ILD1. First through fourth source/drain electrodes 151 through 154 of the fourth conductive layer 150 may be electrically connected to the oxide semiconductor layers 105_2 and 135 respectively through first through fourth contact holes CNT1 through CNT4 formed through the first gate insulating layer GI1 the second gate insulating layer GI2, and the first interlayer insulating layer ILD1.

The current embodiment is different from the embodiment of FIG. 4 in that the oxide semiconductor layers 105_2 and 135 of different transistors are disposed on the same layer and that a second interlayer insulating layer ILD2 and a third gate insulating layer GI3 are omitted.

A display device according to an embodiment may include spacers disposed on side surfaces of a gate electrode of a switching transistor including an oxide semiconductor, and a hydrogen concentration gradation may be formed in a channel region of the switching transistor due to the spacers. In the display device, the switching transistor may have excellent characteristics even if it has a short channel length, and a high-resolution display device may be advantageously realized.

In concluding the detailed description, those skilled in the art will appreciate that many variations and modifications can be made to the preferred embodiments without substantially departing from the principles of the inventive concept. Therefore, the disclosed preferred embodiments of the inventive concept are used in a generic and descriptive sense only and not for purposes of limitation.

What is claimed is:
1. A display device comprising:
a substrate;
a first semiconductor layer disposed on the substrate;
a first gate insulating layer disposed on the first semiconductor layer;
a first gate electrode disposed on the first gate insulating layer and overlapping the first semiconductor layer;
a first interlayer insulating layer disposed on the first gate electrode;
a first oxide semiconductor layer disposed on the first interlayer insulating layer not to overlap the first semiconductor layer;
a second gate insulating layer disposed on the first oxide semiconductor layer;
a second gate electrode disposed on the second gate insulating layer and overlapping the first oxide semiconductor layer;
spacers disposed on side surfaces of the second gate electrode; and
a second interlayer insulating layer disposed on the spacers,
wherein each of the spacers comprises a first spacer disposed to contact a side surface of the second gate electrode and a second spacer disposed on the first spacer, and
wherein a concentration of hydrogen included in the first spacer is lower than a concentration of hydrogen included in the second spacer.

2. The display device of claim 1, wherein a lower surface and an inner side surface of the second spacer contact the first spacer, and
an outer side surface of the second spacer has a curved shape.

3. The display device of claim 1, wherein an upper surface of the second gate electrode directly contacts the second interlayer insulating layer.

4. The display device of claim 1, wherein a concentration of hydrogen included in the second interlayer insulating layer is higher than the concentration of hydrogen included in each of the first spacer and the second spacer.

5. The display device of claim 1, wherein the first semiconductor layer comprises a first channel region overlapping the first gate electrode, and
wherein the first oxide semiconductor layer comprises a second channel region overlapping the second gate electrode and the spacers.

6. The display device of claim 5, wherein a length of the second channel region is greater than a width of the second gate electrode.

7. The display device of claim 5, wherein a length of the first channel region is the same as a width of the first gate electrode.

8. The display device of claim 5, wherein the first semiconductor layer comprises a first source/drain region and a second source/drain region spaced apart from each other with the first channel region interposed therebetween, and
wherein the first oxide semiconductor layer comprises a third source/drain region and a fourth source/drain region spaced apart from each other with the second channel region interposed therebetween.

9. The display device of claim 8, wherein the second channel region comprises a first region overlapping the second gate electrode, a second region having a higher hydrogen concentration than the first region, and a third region having a higher hydrogen concentration than the second region.

10. The display device of claim 1, further comprising:
a third gate insulating layer disposed between the first gate electrode and the second gate insulating layer; and
a bottom light-blocking pattern and a capacitor first electrode disposed between the second gate insulating layer and the third gate insulating layer,
wherein the first gate electrode overlaps the capacitor first electrode in a thickness direction, and
wherein the first oxide semiconductor layer is directly disposed on the third gate insulating layer and overlaps the bottom light-blocking pattern in the thickness direction.

11. The display device of claim 10, further comprising:
a first contact hole and a second contact hole which is formed through the first gate insulating layer, the second gate insulating layer, the third gate insulating layer, the first interlayer insulating layer, and the second interlayer insulating layer; and
a third contact hole and a fourth contact hole which is formed through the second gate insulating layer and the second interlayer insulating layer.

12. The display device of claim 11, further comprising:
a first source/drain electrode disposed on the second interlayer insulating layer and connected to the first semiconductor layer exposed through the first contact hole;
a second source/drain electrode disposed on the second interlayer insulating layer and connected to the first semiconductor layer exposed through the second contact hole;
a third source/drain electrode disposed on the second interlayer insulating layer and connected to the first oxide semiconductor layer exposed through the third contact hole; and
a fourth source/drain electrode disposed on the second interlayer insulating layer and connected to the first oxide semiconductor layer exposed through the fourth contact hole.

13. A display device comprising a pixel connected to a scan line and a data line intersecting the scan line, wherein the pixel comprises:
a light emitting element;
a first transistor which controls a driving current supplied to the light emitting element according to a data voltage applied from the data line; and
a second transistor which applies a voltage to the first transistor according to a scan signal transmitted to the scan line,
wherein the first transistor comprises a first semiconductor layer and a first gate electrode disposed on the first semiconductor layer,
wherein the second transistor comprises a first oxide semiconductor layer, a second gate electrode disposed on the first oxide semiconductor layer, a first spacer which is disposed on a first gate insulating layer disposed between the first oxide semiconductor layer and the second gate electrode and is disposed on each side surface of the second gate electrode, and a second spacer which is disposed on the first spacer, and
wherein a concentration of hydrogen included in the first spacer is lower than a concentration of hydrogen included in the second spacer.

14. The display device of claim 13, wherein the first spacer has a lower surface in contact with an upper surface of the first gate insulating layer and a side surface in contact with each side surface of the first gate electrode, and the second spacer has a lower surface and an inner side surface in contact with the first spacer and has an outer side surface having a curved shape.

15. The display device of claim 13, wherein the first oxide semiconductor layer comprises a channel region overlapping the second gate electrode and the spacers, and
wherein the channel region comprises a first region overlapping the second gate electrode, a second region having a higher hydrogen concentration than the first region, and a third region having a higher hydrogen concentration than the second region.

16. The display device of claim 13, further comprising a first interlayer insulating layer which is disposed on the second gate electrode and the first gate insulating layer,
wherein a concentration of hydrogen included in the first interlayer insulating layer is higher than the concentration of hydrogen included in each of the first spacer and the second spacer.

17. The display device of claim 16, further comprising a second gate insulating layer which is disposed between the first semiconductor layer and the first gate electrode,
wherein the first oxide semiconductor layer is disposed on the second gate insulating layer.

\* \* \* \* \*